US012438051B2

(12) United States Patent
Benno et al.

(10) Patent No.: US 12,438,051 B2
(45) Date of Patent: Oct. 7, 2025

(54) DICING SYSTEM AND DICING METHOD

(71) Applicant: Panasonic Intellectual Property Management Co., Ltd., Osaka (JP)

(72) Inventors: Hiroshi Benno, Osaka (JP); Koji Tamura, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 772 days.

(21) Appl. No.: 17/763,276

(22) PCT Filed: Sep. 1, 2020

(86) PCT No.: PCT/JP2020/033112
§ 371 (c)(1),
(2) Date: Mar. 24, 2022

(87) PCT Pub. No.: WO2021/059900
PCT Pub. Date: Apr. 1, 2021

(65) Prior Publication Data
US 2022/0392807 A1 Dec. 8, 2022

(30) Foreign Application Priority Data
Sep. 27, 2019 (JP) ................... 2019-177075

(51) Int. Cl.
*H01L 21/78* (2006.01)
*G05B 19/4155* (2006.01)
(Continued)

(52) U.S. Cl.
CPC .......... *H01L 21/78* (2013.01); *G05B 19/4155* (2013.01); *H01L 21/67092* (2013.01);
(Continued)

(58) Field of Classification Search
CPC ............... H01L 21/78; H01L 21/67092; H01L 21/67253; H01L 22/20; H01L 22/26;
(Continued)

(56) References Cited

U.S. PATENT DOCUMENTS 6,215,127 B1 * 4/2001 Yu ...................... G03F 7/70658
250/398
9,034,771 B1   5/2015 Nangoy
(Continued)

FOREIGN PATENT DOCUMENTS

CN   101165616 A   4/2008
CN   107180754 A   9/2017
(Continued)

OTHER PUBLICATIONS

Chinese Office Action with its partical English translation dated Aug. 1, 2024 issued in the corresponding Chinese Patent Application No. 202080066998.9.
(Continued)

Primary Examiner — Joshua L Allen
Assistant Examiner — Christopher Remavege
(74) Attorney, Agent, or Firm — MCDONALD HOPKINS LLC

(57) ABSTRACT

Disclosed is a dicing system including a protection layer forming apparatus, a patterning apparatus, a plasma treatment apparatus, a measuring apparatus that obtains at least of first processing data relating to a protection layer, second processing data relating to a mask, and third processing data relating to element chips, and a control unit that operates at least one of the protection layer forming apparatus, the patterning apparatus, and the plasma treatment apparatus on a recipe that is defined for each of the apparatuses. The control unit determines, based on at least one of the first processing data, whether or not to modify the recipe, the
(Continued)

second processing data, and the third processing data, modifies the at least one of the recipes if the recipe needs to be modified, and operates at least one of the protection layer forming apparatus, the patterning apparatus, and the plasma treatment apparatus based on the modified recipe.

13 Claims, 20 Drawing Sheets

(51) Int. Cl.
    *H01L 21/66*     (2006.01)
    *H01L 21/67*     (2006.01)

(52) U.S. Cl.
    CPC ........ *H01L 21/67253* (2013.01); *H01L 22/20* (2013.01); *G05B 2219/45212* (2013.01)

(58) Field of Classification Search
    CPC ....... G05B 19/4155; G05B 2219/45212; H01J 37/32935
    See application file for complete search history.

(56) References Cited

U.S. PATENT DOCUMENTS

| | | | | |
|---|---|---|---|---|
| 10,748,957 | B1* | 8/2020 | McKnight | H01L 27/14607 |
| 2002/0189758 | A1* | 12/2002 | Shiga | H01L 21/67253 |
| | | | | 156/345.31 |
| 2005/0009215 | A1* | 1/2005 | Goto | H01L 21/31138 |
| | | | | 257/E21.256 |
| 2005/0095774 | A1* | 5/2005 | Ushiku | G05B 19/41885 |
| | | | | 438/222 |
| 2007/0253001 | A1* | 11/2007 | Watanabe | H01L 21/67253 |
| | | | | 356/601 |
| 2008/0183312 | A1* | 7/2008 | Funk | G05B 19/41865 |
| | | | | 700/45 |
| 2009/0132078 | A1 | 5/2009 | Sakano | |
| 2013/0071955 | A1* | 3/2013 | Kintaka | H01L 22/20 |
| | | | | 257/E21.528 |
| 2013/0267076 | A1* | 10/2013 | Lei | B23K 26/40 |
| | | | | 438/460 |
| 2014/0120698 | A1 | 5/2014 | Lei et al. | |
| 2014/0213041 | A1* | 7/2014 | Lei | H01L 21/31127 |
| | | | | 438/462 |
| 2017/0263461 | A1 | 9/2017 | Matsubara et al. | |
| 2018/0240697 | A1* | 8/2018 | Okita | H01J 37/32816 |
| 2019/0080965 | A1* | 3/2019 | Seddon | H01L 21/0332 |
| 2019/0252224 | A1 | 8/2019 | Oka | |
| 2021/0384077 | A1* | 12/2021 | Seddon | H01L 21/3247 |

FOREIGN PATENT DOCUMENTS

| | | |
|---|---|---|
| CN | 110164746 A | 8/2019 |
| JP | 2005-109437 A | 4/2005 |
| JP | 2015-519732 A | 7/2015 |
| JP | 2016-506087 A | 2/2016 |
| JP | 2017-523616 A | 8/2017 |

OTHER PUBLICATIONS

International Search Report issued in Patent Application No. PCT/JP2020/033112 dated Oct. 13, 2020.

\* cited by examiner

FIG. 7 (MODE I-b)

FIG. 8 (MODE I-c)

FIG. 9 (MODE II-a)

FIG. 14 (MODE II-b)

FIG. 15 (MODE III-a)

FIG. 17 (MODE III-b)

DICING SYSTEM AND DICING METHOD

TECHNICAL FIELD

The present invention relates to a dicing system and a dicing method for a substrate that use plasma.

BACKGROUND ART

As a method for producing a plurality of element chips by dividing a substrate, there has been proposed a method in which the substrate is covered by a protection layer, thereafter the protection layer is patterned to form a mask, and subsequently the substrate exposed from the mask is plasma etched (PTL 1).

CITATION LIST

Patent Literature

[PTL 1] Japanese Laid-Open Patent Publication (Translation of PCT Application) No. 2015-519732

SUMMARY OF INVENTION

Technical Problem

The element chips produced through plasma etching are produced by undergoing a plurality of steps such as a step of forming a protection layer, a step of patterning the protection layer, and a step of performing plasma etching. For this reason, if there are variations in the shape of the protection layer or the mask produced in the steps, the etching amount, or the like, the shape and the quality of the element chips are unstable.

Solution to Problem

An aspect of the present invention relates to a dicing system including: a protection layer forming apparatus that forms a protection layer on a surface of a substrate; a patterning apparatus that patterns the protection layer to form a mask; a plasma treatment apparatus that plasma etches the substrate exposed from the mask to form a plurality of element chips; a measuring apparatus that obtains at least one processing data selected from the group consisting of first processing data relating to the protection layer, second processing data relating to the mask, and third processing data relating to the element chips; and a control unit that operates at least one apparatus selected from the group consisting of the protection layer forming apparatus, the patterning apparatus, and the plasma treatment apparatus based on a recipe that is defined for each of the apparatuses, wherein the control unit determines, based on at least one of the at least one processing data, whether or not to modify the recipe, modifies at least one of the recipes if the recipe needs to be modified, and operates at least one apparatus selected from the group consisting of the protection layer forming apparatus, the patterning apparatus, and the plasma treatment apparatus based on the modified recipe.

Another aspect of the present invention relates to a dicing method including: a protection layer forming step of forming, based on a first recipe, a protection layer on a surface of a substrate; a patterning step of patterning, based on a second recipe, the protection layer to form a mask; a plasma treatment step of plasma etching, based on a third recipe, the substrate exposed from the mask to form a plurality of element chips; a measuring step of obtaining at least one processing data selected from the group consisting of first processing data relating to the protection layer, second processing data relating to the mask, and third processing data relating to the element chips; a recipe modifying step of determining, based on at least one of the obtained at least one processing data, whether or not to modify at least one recipe selected from the group consisting of the first recipe, the second recipe, and the third recipe, and modifying the at least one recipe if the at least one recipe needs to be modified; and a feedback step of feeding back the modified at least one recipe to control of the step corresponding to the at least one recipe. In a first example of the dicing method, the at least one recipe is the first recipe, and if the first recipe needs to be modified, the modified first recipe is fed back to control of the protection layer forming step in the feedback step. In a second example of the dicing method, the at least one recipe is the second recipe, and if the second recipe needs to be modified, the modified second recipe is fed back to control of the patterning step in the feedback step. In a third example of the dicing method, the at least one recipe is the third recipe, and if the third recipe needs to be modified, the modified third recipe is fed back to control of the plasma treatment step in the feedback step.

Another aspect of the present invention relates to a dicing method including: a protection layer forming step of forming, based on a first recipe, a protection layer on a surface of a substrate; a patterning step of patterning, based on a second recipe, the protection layer to form a mask; a plasma treatment step of plasma etching, based on a third recipe, the substrate exposed from the mask to form a plurality of element chips; a measuring step of obtaining at least one of first processing data relating to the protection layer, second processing data relating to the mask, and third processing data relating to the element chips; a first recipe modifying step of determining, based on at least one of the first processing data, the second processing data, and the third processing data that have been obtained, whether or not to modify the first recipe, and modifying the first recipe if the first recipe needs to be modified; and a first feedback step of feeding back the modified first recipe to control of the protection layer forming step.

Still another aspect of the present invention relates to a dicing method including: a protection layer forming step of forming, based on a first recipe, a protection layer on a surface of a substrate; a patterning step of patterning, based on a second recipe, the protection layer to form a mask; a plasma treatment step of plasma etching, based on a third recipe, the substrate exposed from the mask to form a plurality of element chips; a measuring step of obtaining at least one of first processing data relating to the protection layer, second processing data relating to the mask, and third processing data relating to the element chips; a second recipe modifying step of determining, based on at least one of the second processing data, the second processing data, and the third processing data that have been obtained, whether or not to modify the second second recipe, and modifying the second recipe if the second recipe needs to be modified; and a second feedback step of feeding back the modified second recipe to control of the patterning step.

Yet another aspect of the present invention relates to a dicing method including: a protection layer forming step of forming, based on a first recipe, a protection layer on a surface of a substrate; a patterning step of patterning, based on a second recipe, the protection layer to form a mask; a plasma treatment step of plasma etching, based on a third recipe, the substrate exposed from the mask to form a plurality of element chips; a measuring step of obtaining at least one of first processing data relating to the protection layer, second processing data relating to the mask, and third processing data relating to the element chips; a third recipe modifying step of determining, based on at least one of the third processing data, the second processing data, and the third processing data that have been obtained, whether or not to modify the third recipe, and modifying the third recipe if the third recipe needs to be modified; and a third feedback step of feeding back the modified third recipe to control of the plasma treatment step.

Still yet another aspect of the present invention relates to a dicing method including: a protection layer forming step of forming, based on a first recipe, a protection layer on a surface of a substrate; a patterning step of patterning, based on a second recipe, the protection layer to form a mask; a plasma treatment step of plasma etching, based on a third recipe, the substrate exposed from the mask to form a plurality of element chips; a measuring step of obtaining second processing data relating to the mask; a third recipe modifying step of determining, based on the obtained second processing data, whether or not to modify the third recipe, and modifying the third recipe if the third recipe needs to be modified; and a feedforward step of feeding forward the modified third recipe to control of the plasma treatment step.

Advantageous Effects of Invention

According to the present invention, the quality of the resulting element chips is improved.

While the novel features of the invention are set forth in the appended claims, the invention, both as to organization and content, will be better understood and appreciated, along with other objects and features thereof, from the following detailed description taken in conjunction with the drawings.

DESCRIPTION OF EMBODIMENT

Figure 1:
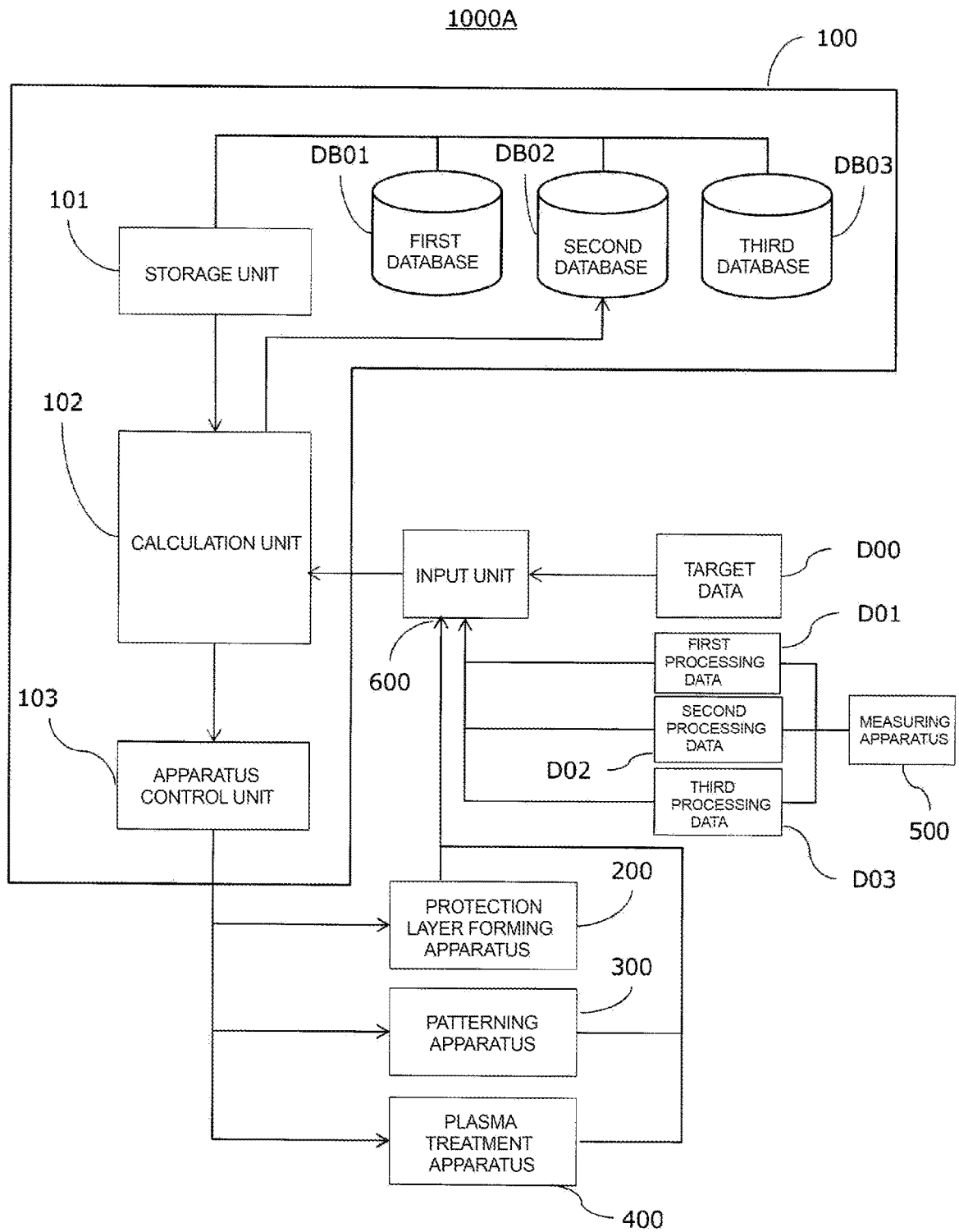
FIG. 1 is a block diagram showing an example of a configuration of a dicing system according to an embodiment of the present invention.

A recipe (etching condition) used for plasma etching is usually determined by analyzing an enormous amount of accumulated processing data. The processing data is obtained by repeating processing while varying the etching conditions for each substrate to be etched. The determined recipe is input to a plasma treatment apparatus, and plasma etching is performed based on the recipe. Usually, plasma etching is continuously performed on a plurality of substrates of the same type.

The above-described recipe determination is performed on the assumption that a mask that is set in a target state is formed on the substrate. However, in the actual processing, the state of the mask may not match the set value. For example, the actual patterning width may be larger than the set value. In this case, if plasma etching is performed using a recipe determined from the past processing data, the etching amount of the substrate becomes excessive, resulting in a reduction in the quality of the resulting element chips.

Even if the etching condition is set in accordance with the recipe, the desired etching may not be performed depending on the internal state of the apparatus used, and the aging of components Therefore, in the present embodiment, the etching condition is modified based on data relating to the shape of an actually formed mask, and the plasma treatment apparatus is feedback controlled or feedforward controlled. In addition, the present embodiment includes a mode in which a protection layer forming condition is modified based on data relating to the shape of an actually formed mask, and a protection layer forming apparatus is feedback controlled, and a mode in which a patterning condition is modified based on data relating to the shape of an actually formed mask, and a patterning apparatus is feedback controlled.

Furthermore, the present embodiment includes a mode in which a protection layer forming condition is modified based on data relating to actually produced element chips, and a protection layer forming apparatus is feedback controlled, a mode in which a patterning condition is modified based on data relating to actually produced element chips, and a patterning apparatus is feedback controlled, and a mode in which an etching condition is modified based on data relating to actually produced element chips, and a plasma treatment apparatus is feedback controlled. By performing at least one of the feedforward controls and the feedback controls described above, the quality of the resulting element chips is improved. Through the feedback control and the feedforward, the recipe is modified using data relating to an actually formed mask and/or data relating to element chips obtained through etching treatment, and the modified recipe is applied to a dicing process. This makes it possible to efficiently manufacture high-quality element chips.

The generation of the modified recipe can be automatically performed using an algorithm for recipe generation. The application of the modified recipe to each of the apparatuses is also automatically performed by the control unit. Accordingly, the number of the steps is reduced, resulting in an increase in productivity.

A. Dicing System

A dicing system according to the present embodiment includes a protection layer forming apparatus, a patterning apparatus, a plasma treatment apparatus, a measuring apparatus, and a control unit.

The protection layer forming apparatus forms, based on a first recipe, a protection layer on a surface of a substrate. The patterning apparatus patterns, based on a second recipe, the protection layer to form a mask. The plasma treatment apparatus plasma etches, based on a third recipe, the substrate exposed from the mask to form a plurality of element chips. The measuring apparatus obtains at least one processing data selected from the group consisting of first processing data relating to the protection layer, second processing data relating to the mask, and third processing data relating to the element chips. The control unit controls at least one apparatus selected from the group consisting of the protection layer forming apparatus, the patterning apparatus, and the plasma treatment apparatus.

(Control Unit)

More specifically, the control unit generates a recipe, determines whether or not the recipe needs to be modified, modifies the recipe, and operates each of the apparatuses with an optimal recipe.

Whether or not to modify the recipe is determined based on at least one of the obtained at least one processing data (the first processing data, the second processing data, and the third processing data that have been obtained). For example, if any of the processing data exceeds a tolerable range that is set based on target data, it is determined that the recipe needs to be modified. The target data refers to various types of data relating to the mask and the element chips that are intended to be obtained. The number of pieces of the processing data used may be one or more. A plurality of pieces of processing data may be used to determine whether or not the recipe needs to be modified. The plurality of pieces of processing data may be two or more pieces of first processing data, two or more pieces of second processing data, two or more pieces of third processing data, or a combination of these processing data.

The recipe that is to be modified is not particularly limited, and is at least one recipe (hereinafter may be simply referred to as a "recipe") selected from the group consisting of the first recipe, the second recipe, and the third recipe. The recipe for controlling a step that most significantly affects the deviation between the processing data and the target data may be modified.

One factor that causes the first, second, or third processing data to exceed the tolerable range is a defect in the protection layer. In this case, the first recipe is modified. Then, the protection layer forming apparatus is feedback controlled such that a protection layer is formed on another substrate that is treated at a subsequent time, based on the modified first recipe.

One factor that causes the second or third processing data to exceed the tolerable range is inappropriate patterning. In this case, the second recipe is modified. Then, the patterning apparatus is feedback controlled such that another substrate that is treated at a subsequent time is patterned based on the modified second recipe.

One factor that causes the third processing data to exceed the tolerable range is inappropriate plasma etching. In this case, the third recipe is modified. Then, the plasma treatment apparatus is feedback controlled such that another substrate that is treated at a subsequent time is plasma-treated based on the modified third recipe.

Even if the second processing data exceeds the tolerable range, the third processing data can be brought within the tolerable range by modifying the recipe used during the plasma treatment. That is, there are cases where high-quality element chips can be formed by resetting an etching condition suitable for a formed mask. In this case, the third recipe is modified, and the plasma treatment apparatus is feedback controlled or feedforward controlled such that a substrate is plasma-treated based on the modified third recipe.

For example, an input unit is connected to the control unit, in addition to the protection layer forming apparatus, the patterning apparatus, and the plasma treatment apparatus. The input unit is installed in each of the apparatuses, for example. For example, at least one of the target data, the first processing data, the second processing data, and the third processing data is input to the input unit. The inputting of the target data is performed by an operator. The inputting of the above-described processing data may be performed by the operator, or may be automatically performed from the measuring apparatus.

The manager who owns a server to which the control unit is connected, the owner of the protection layer forming apparatus, the owner of the patterning apparatus, and the owner of the plasma treatment apparatus may be different from each other. The server and each of the apparatuses are connected to each other via a computer network. After necessary data has been input to the input unit, the data is transmitted to the server. The control unit reads out the necessary data from the server, performs calculation or the like as needed, and remotely operates each of the apparatuses based on the result of the calculation or the like.

The control unit includes, for example, a storage unit, a calculation unit, and an apparatus control unit.

A first database in which information for generating a recipe is stored is connected to the storage unit. Accumulated past processing data, substrate data relating to a substrate that is to be etched, and facility data relating to at least one of the protection layer forming apparatus, the patterning apparatus, and the plasma treatment apparatus are stored in the first database.

The accumulated processing data includes an etching condition, and the etching rate and the etching depth of element chips, the width and the aspect ratio of formed grooves, and the like that are associated with the etching condition. The substrate data includes a lot number, the material of the substrate, the type of the elements mounted thereon, and the like. The facility data includes the specifications of each of the apparatuses, the last maintenance date, the processing history, log data during processing, and the like.

When a dicing process has been started, the calculation unit first generates an optimal recipe (initial recipe) for the intended substrate, based on the various types of data stored in the first database, and the target data that has been input to the input unit. However, any of the first recipe, the second recipe, the third recipe may be determined in advance. In this case, an initial recipe other than the determined recipe is generated. The determined recipe may be input to the input unit. The input target data is stored in the first database.

When the dicing process progresses, and at least one of the first processing data, the second processing data, and the third processing data is input to the input unit, the calculation unit determines whether or not to modify the initial recipe, based on the various types of data stored in the first database, and the newly input processing data. If it is determined that the initial recipe needs to be modified, the control unit generates a modified recipe, to modify the initial recipe. A predetermined algorithm is used for the generation of the initial recipe and the modified recipe.

The recipe generated by the calculation unit is stored as a second database in the storage unit. The initial recipe and the modified recipe generated by the calculation unit are stored in the second database. The recipes stored in the second database, together with the first database, may be used for the generation of the modified recipe and the generation of an initial recipe of another type of substrate.

The apparatus control unit operates the protection layer forming apparatus, the patterning apparatus, and the plasma treatment apparatus based on the generated initial recipe or modified recipe.

(Simulator)

The dicing system may further include a simulator. The simulator calculates, based on the second processing data and the third recipe, predicted data relating to the processed shape of the element chips. The predicted data is stored as a third database in the storage unit. The third recipe used by the simulator may be either the initial recipe or the modified recipe. The simulator includes a computer, for example. The above-described server may include a simulator (i.e., a simulation function).

The simulator can be further used for generating the third recipe. For example, using the simulator, a plurality of processed shapes of the resulting element chips are predicted based on the second processing data and the accumulated processing data. Then, the calculation unit calculates the difference between the desired processed shape and each of the predicted plurality of processed shapes of the element chips, and generates an optimal third recipe taking these differences into account. This third recipe is used for plasma treatment, in place of the initial third recipe.

In addition, the predicted data can be used to determine whether or not there is an abnormality in the plasma treatment apparatus. For example, if the absolute value of the difference between the predicted data calculated by the simulator and the third processing data, which is an actual measured value, exceeds a predetermined threshold, it can be determined that there is an abnormality in the plasma treatment apparatus. In this case, it is desirable to perform maintenance of the apparatus. On the other hand, if the absolute value of the difference between the predicted data and the third processing data is smaller than the threshold, it can be determined that there is no abnormality in the plasma treatment apparatus. In this case, the simulator may be further used to generate a third recipe in the above-described manner. This third recipe is used for plasma treatment, in place of the initial third recipe.

(Notification Unit)

In the present embodiment, a notification unit is installed in the dicing system, and the notification unit is caused to notify a maintenance timing.

Specifically, in the dicing system including the simulator, if the absolute value of the difference between the predicted data and the third processing data, which is an actual measured value, is greater than a preset threshold, the control unit uses a predetermined algorithm to determine which of the protection layer forming apparatus, the patterning apparatus, and the plasma treatment apparatus is the causal apparatus, and calculates the maintenance timing. The result of the calculation is notified by the notification unit to the owner or operator of each of the apparatuses. On the other hand, if the absolute value of the difference between the predicted data and the third processing data, which is an actual measured value, is less than or equal to the preset threshold, the control unit is caused to determine whether or not to generate a modified recipe in the above-described manner. Usually, the threshold is set so as to exceed the tolerable range of the target data.

The notification unit includes, for example, a display unit for displaying the maintenance timing, or a sound generating unit that notifies that the maintenance timing has arrived. The notification unit notifies the maintenance timing to the owner or operator of each of the apparatuses, using a display or sound. The notification unit can further notify another information. The notification unit may be installed in any of the mask forming apparatus, the patterning apparatus, and the plasma treatment apparatus, or may be installed in the server that includes the control unit.

(Ordering Unit)

The dicing system may further include an ordering unit that automatically orders a component of each apparatus. The control unit causes the notification unit to notify the maintenance timing of the causal apparatus, and causes the ordering unit to order a component of the causal apparatus. This allows for predictive maintenance of the dicing system, resulting in an increase in productivity.

(Protection Layer Forming Apparatus)

The protection layer forming apparatus is not particularly limited, as long as a protection layer can be formed on a surface of a substrate. Examples of the protection layer forming apparatus include a spin coater, a spray coater, a die coater, and a laminator.

Examples of the first recipe include the type of a mask material, and the coating amount and the coating speed of the mask material.

(Patterning Apparatus)

The patterning apparatus is not particularly limited, as long as the protection layer can be patterned. The patterning apparatus may be selected as appropriate according to the material of the protection layer. When the protection layer is made of a photosensitive resin, the protection layer can be patterned by an exposure apparatus. When the protection layer is made of another resin, the protection layer can be patterned by a laser processing apparatus.

In the case of using the exposure apparatus, examples of the second recipe include an exposure amount and a depth of focus.

In the case of using the laser processing apparatus, examples of the second recipe include a laser output, a scanning speed, a pulse width, and a frequency.

(Plasma Treatment Apparatus)

The plasma treatment apparatus is not particularly limited, as long as the substrate exposed from the mask can be plasma etched. The plasma treatment apparatus includes, for example, a reaction chamber, a plasma generating part that generates plasma in the reaction chamber, and a stage installed inside the reaction chamber and on which a substrate is to be placed. The plasma generating part is composed of, for example, an electrode installed at an upper portion of the reaction chamber, and a process gas source that supplies a plasma generating gas (process gas) into the reaction chamber. As a result of high-frequency power being supplied to the above-described electrode, with the process gas supplied in the reaction chamber, plasma is generated inside the reaction chamber.

Examples of the third recipe include the pressure inside the reaction chamber, the type and the flow rate of the process gas, the magnitude of the high-frequency power, the frequency of the high-frequency wave, and the treatment time.

(Measuring Apparatus)

The measuring apparatus is not particularly limited, as long as at least one of first processing data relating to the protection layer, second processing data relating to the mask, and third processing data relating to the element chips can be obtained. Examples of the measuring apparatus include an optical shape measuring apparatus and a scanning electron microscope (SEM).

Examples of the first processing data include the film thickness of the protection layer and variations thereof, and a parameter representing the surface state of the protection layer. The parameter representing the surface state of the protection layer includes, for example, the presence or absence of pinholes and the roughness (flatness) on the surface of the protection layer. When the substrate has projections and recesses on the surface, the parameter representing the surface state of the protection layer includes data relating to the covering state of the projections and recesses by the protection layer.

Examples of the second processing data include a patterning width and variations thereof, the thickness of the mask and variation thereof, and a parameter representing the surface state of the mask. The parameter representing the surface state of the mask includes, for example, the presence or absence of pinholes and the roughness (flatness) on the mask surface. When the substrate has projections and recesses on the surface, the parameter representing the surface state of the mask includes data relating to the covering state of the projections and recesses by the mask.

Examples of the third processing data include a parameter representing the surface state of the mask covering the surfaces of the element chips, a parameter representing the shape of an end face of each of the element chips, and the distance between adjacent element chips and variations thereof. The parameter representing the surface state of the mask covering the surface of the element chip includes, for example, the presence or absence of pinholes and the roughness (flatness) on the mask surface. When the substrate has projections and recesses on the surface, parameter representing the surface state of the mask covering the surfaces of the element chips include data relating to the covering state of the projections and recesses by the mask.

The parameter representing the shape of an end face of each of the element chips includes, for example, the height and the width of scallops formed on the end face, the size and the number of voids formed on the end face, and the inclination angle and the notch size of the end face. The distance between adjacent element chips include, for example, the distance between element chips on the mask side, and the distance between element chips on a side opposite to the mask.

The data relating to the covering state of the projections and recesses specifically includes the thickness of the protection layer or the mask (hereinafter may be referred to as a protection layer or the like) covering the recesses, the thickness of the protection layer or the like covering the projections, or the ratio between the thicknesses of the protection layers or the like covering the recesses and the projections.

(Substrate)

The substrate that is to be etched is not particularly limited. Examples thereof include a substrate for use in manufacture of electronic devices, a circuit board obtained by forming a circuit on a substrate, a mounting substrate obtained by mounting an electronic component on a circuit board, and a semiconductor substrate. Bumps and pad electrodes or the like may be disposed on the surface of the substrate. In this case, the surface of the substrate may have projections and recesses.

FIG. 1 is a block diagram showing an example of the configuration of a dicing system according to the present embodiment.

A dicing system 1000A includes a control unit 100, a protection layer forming apparatus 200, a patterning apparatus 300, a plasma treatment apparatus 400, a measuring apparatus 500, and an input unit 600.

Target data D00 relating to a target substrate that is to be etched, first processing data D01, second processing data D02, and third processing data D03 are input to the input unit 600. It is sufficient that at least one of the first processing data D01, the second processing data D02, and the third processing data D03 is input. The first processing data D01 is obtained by the measuring apparatus 500 and relates to a formed protection layer. The second processing data D02 is obtained by the measuring apparatus 500 and relates to a formed mask. The third processing data D03 is obtained by the measuring apparatus 500 and relates to formed element chips. The first processing data D01, the second processing data D02, and the third processing data D03 may be obtained by the same measuring apparatus, or by different measuring apparatuses.

The control unit 100 includes a storage unit 101, a calculation unit 102, and an apparatus control unit 103. A first database DB01 and a second database DB02 are stored in the storage unit 101. The accumulated processing data, the substrate data, and the facility data are stored in the first database DB01. An initial recipe and a modified recipe generated by the calculation unit 102 are stored in the second database DB02.

At least one of the first recipe, the second recipe, and the third recipe is generated in the calculation unit 102. The recipe generated here may be an initial recipe, or may be a modified recipe.

The apparatus control unit 103 operates at least one of the protection layer forming apparatus 200, the patterning apparatus 300, and the plasma treatment apparatus 400 based on the generated initial recipe or modified recipe.

Figure 2:
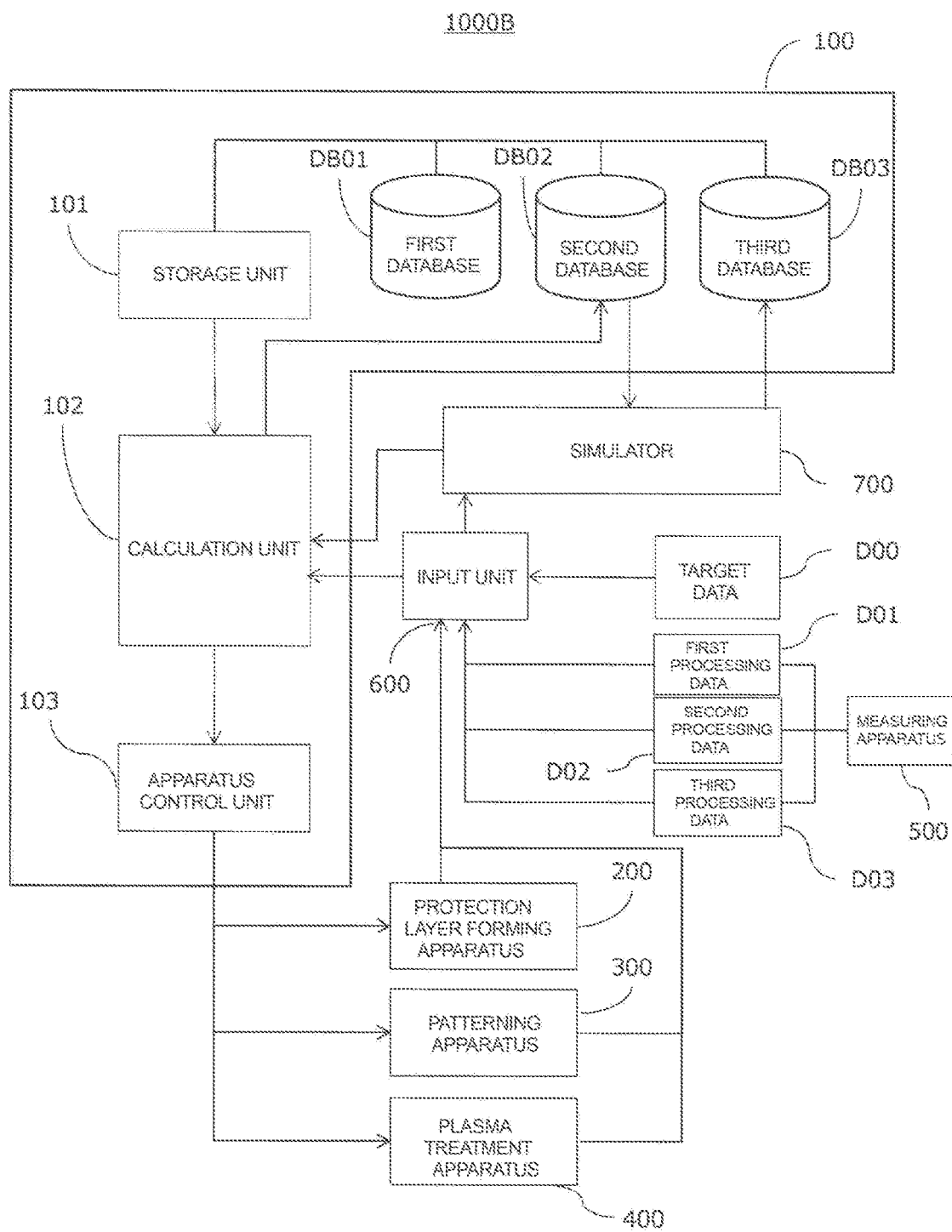
FIG. 2 is a block diagram showing another example of the configuration of the dicing system according to the embodiment of the present invention.

FIG. 2 is a block diagram showing another example of the configuration of the dicing system according to the present embodiment.

A dicing system 1000B has the same configuration as that of the dicing system 1000A shown in FIG. 1 except that the dicing system 1000B includes a simulator 700, and that a third database DB03 is further stored in the storage unit 101.

The simulator 700 calculates predicted data relating to the element chips, based on the second processing data D02 input to the input unit 600, and the third recipe stored in the second database DB02. The calculation unit 102 calculates the difference between the predicted data calculated in the simulator 700 and the third processing data D03, which is an actual measured value, and generates a modified recipe based on this difference. The predicted data calculated in the simulator 700 is stored in the third database DB03.

Figure 3:
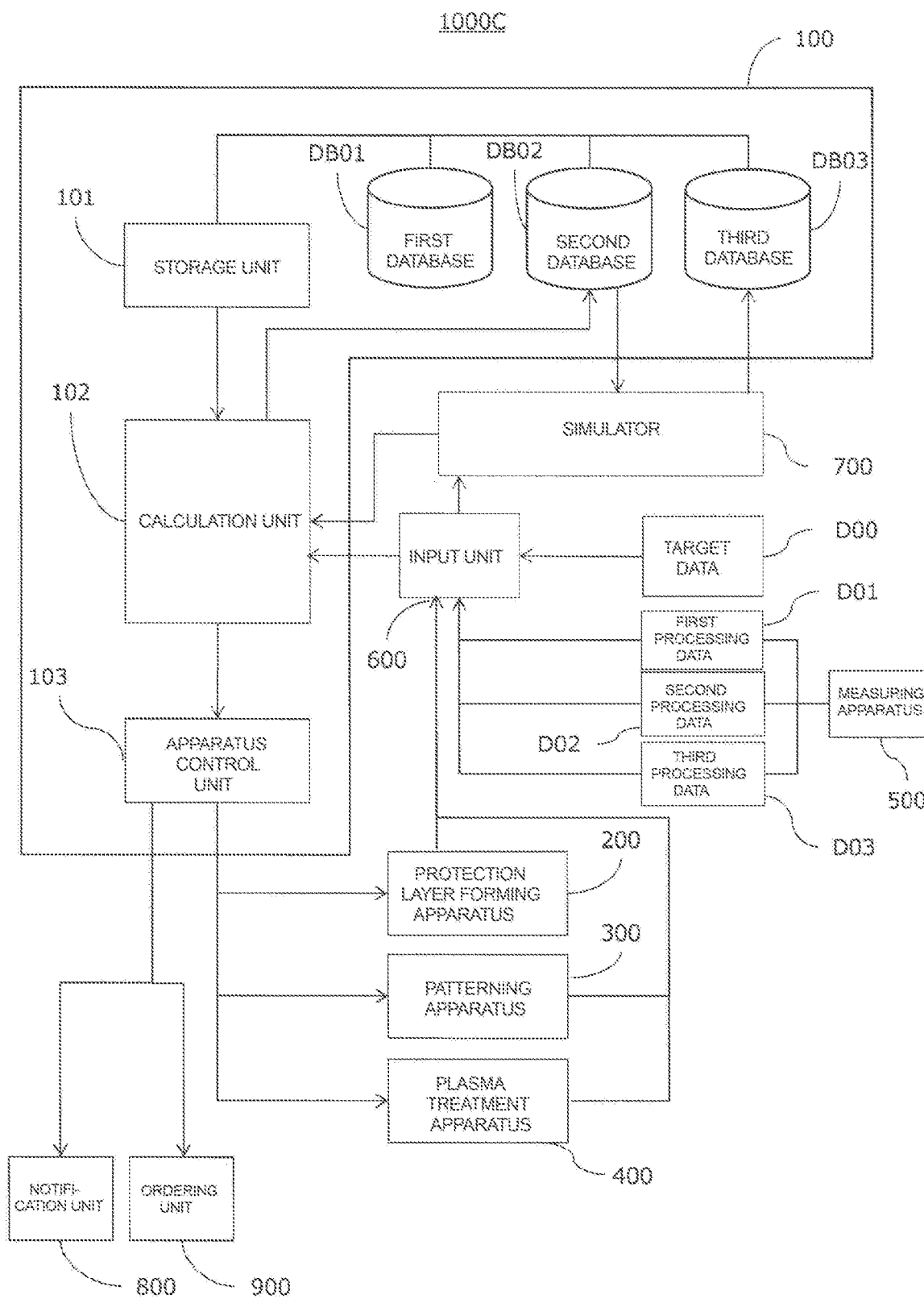
FIG. 3 is a block diagram showing still another example of the configuration of the dicing system according to the embodiment of the present invention.

FIG. 3 is a block diagram showing still another example of the configuration of the dicing system according to the present embodiment.

A dicing system 1000C has the same configuration as that of the dicing system 1000B shown in FIG. 2 except that the dicing system 1000C includes a notification unit 800 and an ordering unit 900.

The calculation unit 102 calculates the difference between the predicted data calculated in the simulator 700 and the third processing data D03, which is an actual measured value, and determines whether or not the absolute value of the difference exceeds the threshold. If the absolute value of the difference exceeds the threshold, the calculation unit 102 performs a further calculation to determine the causal apparatus, and calculates the maintenance timing. The maintenance timing is notified to the owner or operator of the causal apparatus by the notification unit 800. If the absolute value of the difference is less than or equal to the threshold, whether or not to generate a modified recipe is determined.

The ordering unit 900 orders a component of the causal apparatus from a manufacturer as needed.

Figure 4:
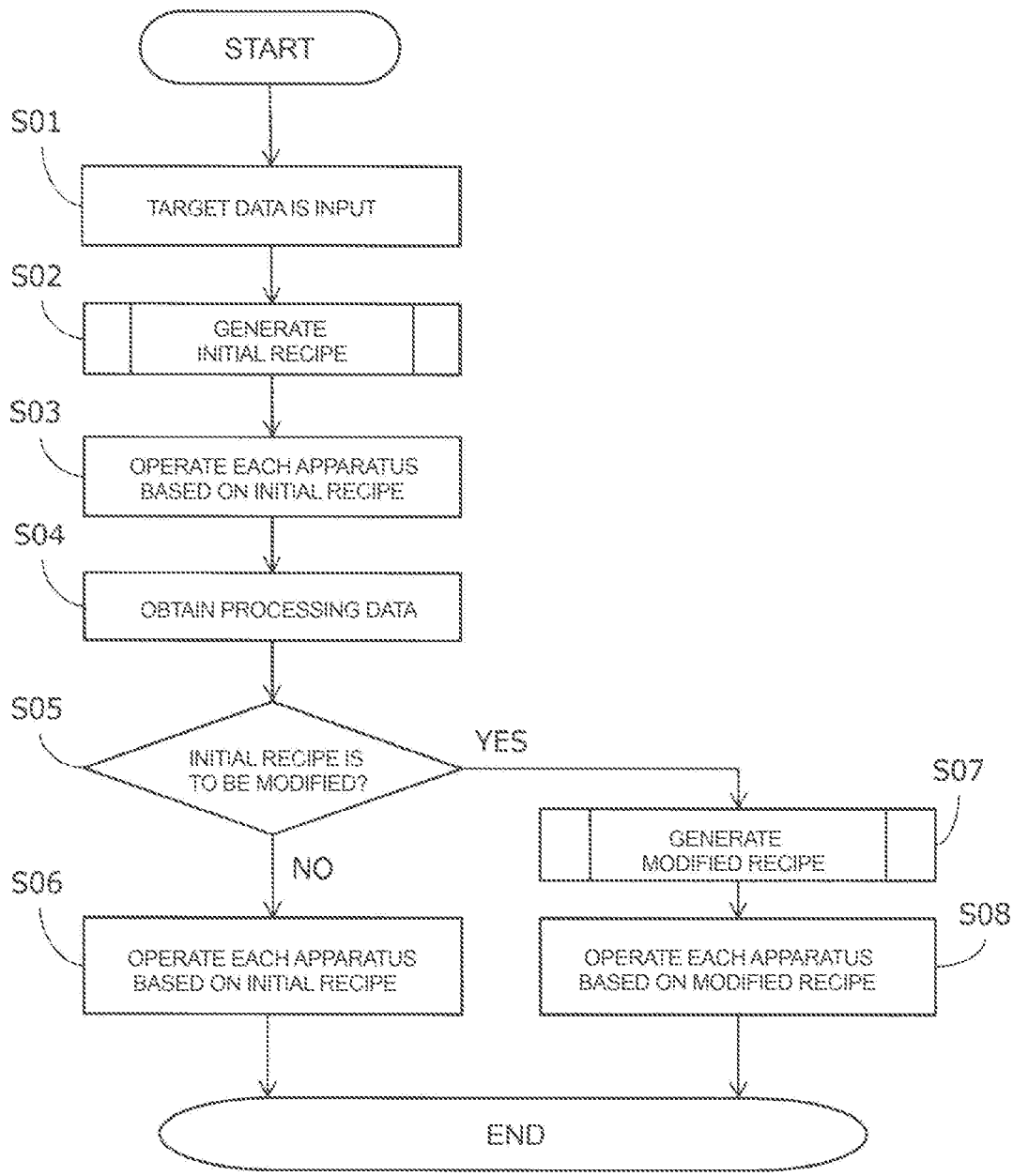
FIG. 4 is a flowchart illustrating an example of processing performed by a control unit according to the embodiment of the present invention.

FIG. 4 is a flowchart illustrating an example of processing performed by the control unit according to the present embodiment.

A dicing process is started, and target data is input to the input unit (S01). The control unit reads out the accumulated processing data stored in the first database, and generates, based on the accumulated processing data and the target data, an initial recipe suitable for the target substrate (S02). The generated initial recipe is stored in the second database. Then, each of the apparatuses is operated based on the initial recipe, and the substrate is processed based on the initial recipe (S03).

The dicing process progresses, and processing data obtained from the substrate that has been processed in the apparatuses, or in other words, at least one of the first processing data, the second processing data, and the third processing data, is obtained (S04). The control unit determines, based on the target data and the processing data, whether or not to modify the initial recipe (S05). If it is determined that the initial recipe does not need to be modified, the apparatuses are controlled so as to be operated based on the initial recipe (S06). On the other hand, if it is determined that the initial recipe needs to be modified, the control unit generates a modified recipe, to modify the initial recipe (S07). The apparatuses are controlled so as to be operated based on the modified recipe (S08). A predetermined algorithm is used for the generation of the initial recipe and the modified recipe. The generated modified recipe is stored in the second database.

Figure 5:
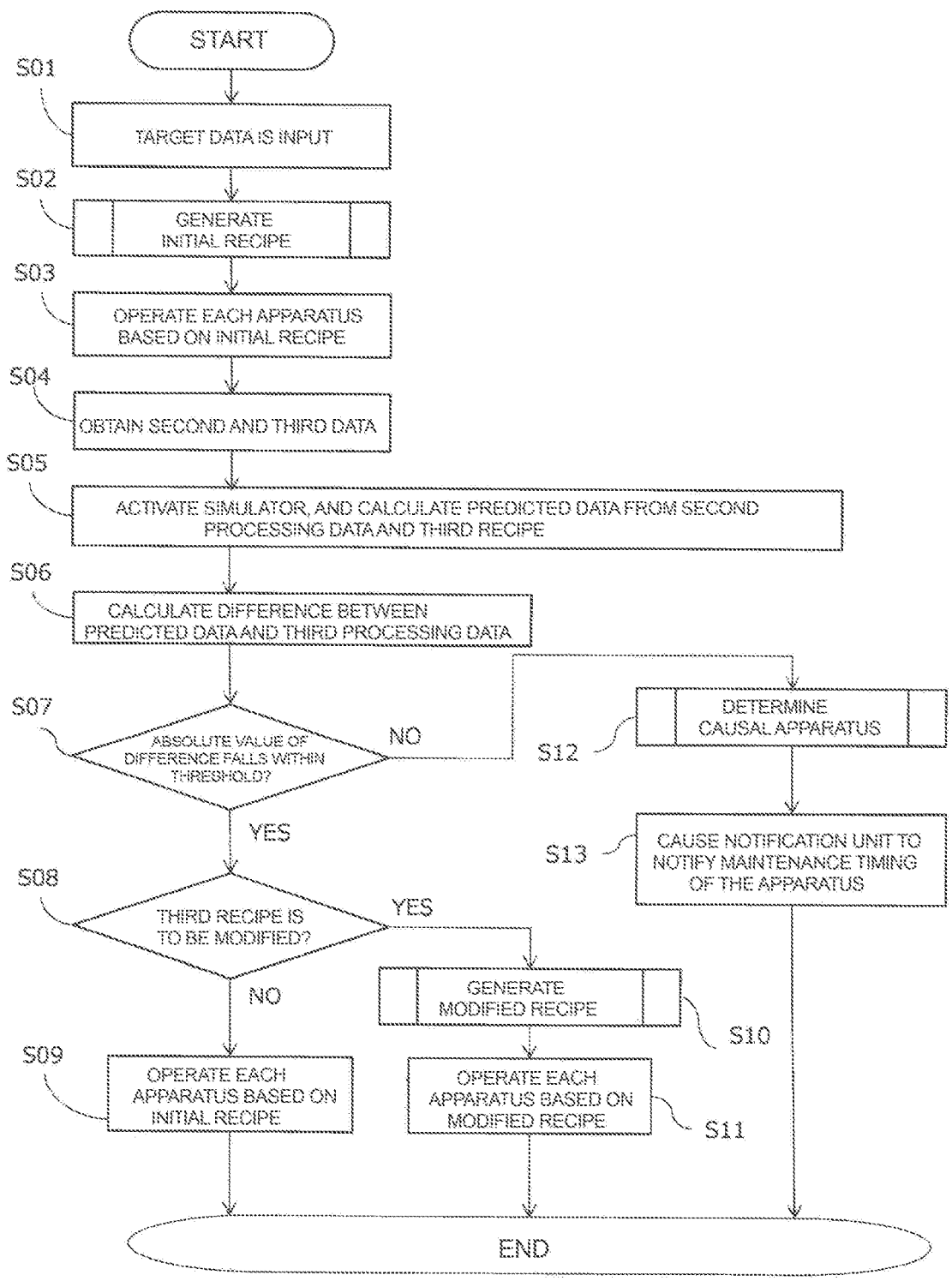
FIG. 5 is a flowchart illustrating another example of the processing performed by the control unit according to the embodiment of the present invention.

FIG. 5 is a flowchart illustrating another example of the processing performed by the control unit according to the present embodiment. FIG. 5 shows a case where the simulator is installed.

A dicing process is started, and target data is input to the input unit (S01). The control unit reads out the accumulated processing data stored in the first database, and generates, based on the accumulated processing data and the target data, an initial recipe suitable for the target substrate (S02). The generated initial recipe is stored in the second database. Then, each of the apparatuses is operated based on the initial recipe, and the substrate is processed based on the initial recipe (S03).

The dicing process progresses, and if both the second processing data and the third processing data are obtained (S04), the control unit reads out the third recipe stored in the second database, and activates the simulator. The simulator calculates, based on the second processing data and the third recipe, predicted data relating to element chips (S05). The predicted data is stored in the third database.

Subsequently, the difference between the calculated predicted data and the third processing data, which is an actual measured value, is calculated (S06). The control unit determines whether or not the absolute value of the difference is within a set threshold (S07). If it is determined that the absolute value of the difference is within the threshold, whether or not to modify the third recipe is determined (S08). The subsequent steps (S09 to S11) are performed in the same manner as with steps S06 to S08 shown in FIG. 4.

On the other hand, if it is determined that the absolute value of the difference is not within the threshold, the control unit uses a predetermined algorithm to determine the causal apparatus, and calculates the maintenance timing (S12). Thereafter, the control unit controls the notification unit to notify the maintenance timing to the operator of the causal apparatus (S13).

B. Dicing Method

A dicing method according to the present embodiment includes: a protection layer forming step of forming, based on a first recipe, a protection layer on a surface of a substrate; a patterning step of patterning, based on a second recipe, the protection layer to form a mask; a plasma treatment step of plasma etching, based on a third recipe, the substrate exposed from the mask to form a plurality of element chips; a measuring step of obtaining at least one of first processing data relating to the protection layer, second processing data relating to the mask, and third processing data relating to the element chips; a recipe modifying step of determining, based on one of the first processing data, the second processing data, and the third processing data, whether or not to modify the recipe, and modifying any of the above-described recipes if the at least one recipe needs to be modified; and a feedback step of feeding back the modified recipe to control of the corresponding step. In the case where the third recipe is modified, the modified recipe may be fed forward.

In the case where the first recipe is modified, the modified recipe is fed back to the protection layer forming apparatus, and the protection layer forming step that is performed at a subsequent time is performed using the modified first recipe. In the case where the second recipe is modified, the modified recipe is fed back to the patterning apparatus, and the patterning step performed at a subsequent time is performed using the modified second recipe. In the case where the third recipe is modified, the modified recipe is fed back or fed forward to the plasma treatment apparatus. In the case where the modified recipe is fed back, the plasma treatment step performed at a subsequent time is performed using the modified third recipe. In the case where the modified recipe is fed forward, the current plasma treatment step is performed using the modified third recipe.

In the following, the dicing method according to the present embodiment will be described by dividing the dicing method into mode I in which whether or not to modify the first recipe is determined, mode II in which whether or not to modify the second recipe is determined, and mode III in which whether or not to modify the third recipe is determined. The illustrated modes are performed by the above-described dicing system. However, the dicing method according to the present embodiment is not limited thereto.

[Mode I]

In the present mode, whether or not to modify the first recipe is determined based on at least one of the first processing data, the second processing data, and the third processing data.

(Mode I-a)

Figure 6:
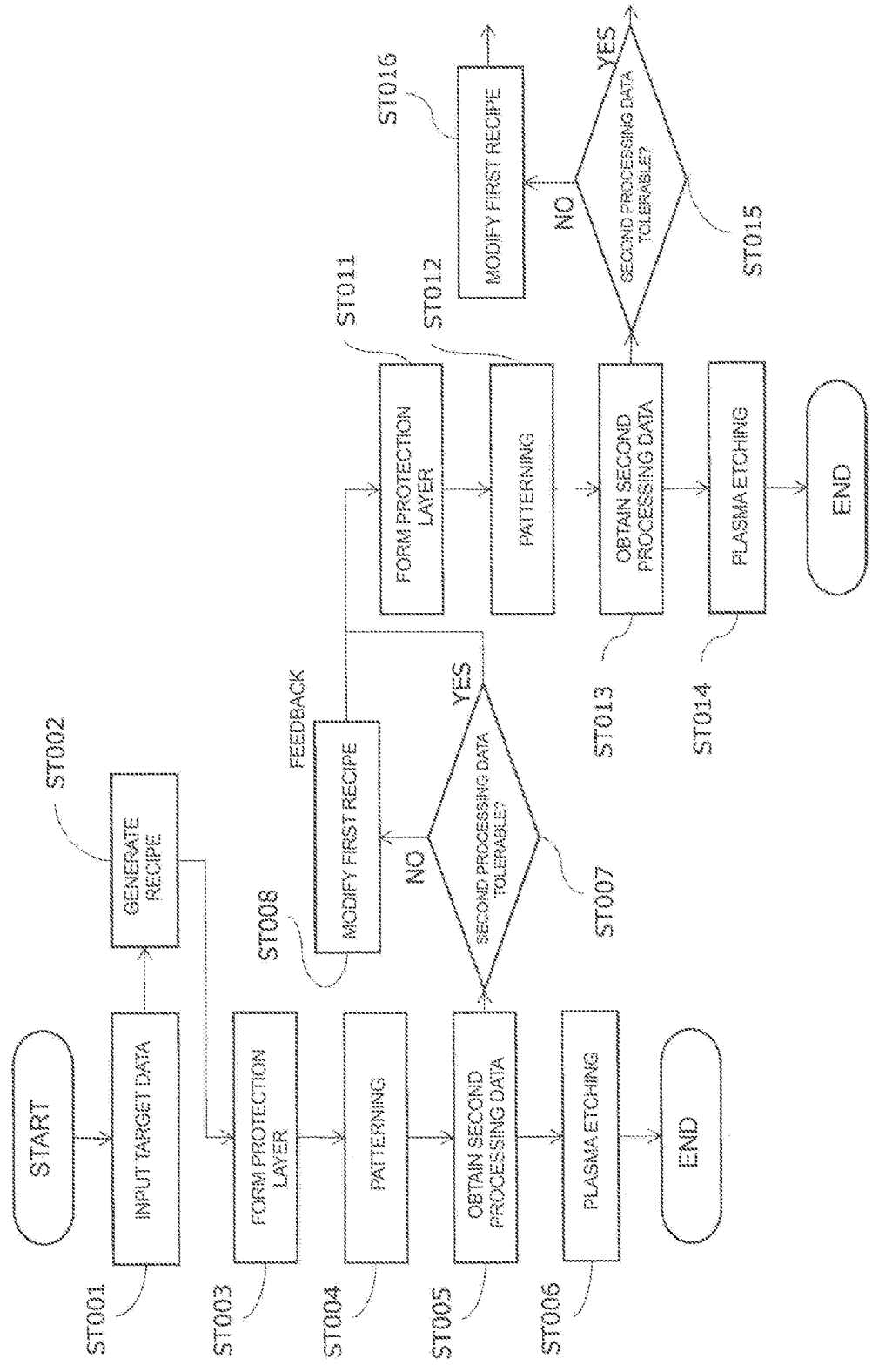
FIG. 6 is a flowchart illustrating mode I-a of a dicing method according to the embodiment of the present invention.

In the present mode, whether or not to modify a first recipe for controlling the protection layer forming step is determined using second processing data relating to a mask formed on the mth (m is an integer of 1 or more) substrate. The modified first recipe is fed back to the protection layer forming step of the m+nth (n is an integer of 1 or more) substrate. FIG. 6 is a flowchart illustrating the present mode.

(1) Input of Target Data

Target data is input to the input unit connected to the control unit (ST001).

The calculation unit uses a predetermined algorithm to generate at least one of a first recipe, a second recipe, and a third recipe from the target data and the first database or the like (ST002). The generated initial recipe is stored in the second database.

(2) Formation of Protection Layer

Based on the first recipe, a protection layer is formed on the surface of the mth substrate (ST003).

The protection layer includes a so-called resist material, including, for example, a thermosetting resin such as polyimide, a photoresist such as phenol resin, or a water-soluble resist such as acrylic resin. The protection layer is formed, for example, by molding the resist material in the form of a sheet and attaching the sheet to a laminate substrate, or applying the raw material liquid of the resist material to the substrate using a method such as spin coating or spray coating.

The thickness of the protection layer is preferably, but is not particularly limited to, a thickness that is not completely removed by the subsequent plasma etching. For example, the total amount (thickness) of the protection layer that is etched during plasma etching is calculated, and the thickness of the protection layer is set to be greater than or equal to this etching amount. The thickness of the protection layer is, for example, 5 μm or more and 60 μm or less.

From the viewpoint of handleability, it is preferable that, from the protection layer forming step and onward, the substrate is treated while supported by a support member. The support member is a resin film, for example. The outer periphery of the support member is fixed to a metal frame, for example.

(3) Patterning

The protection layer is patterned based on the second recipe to form a mask (ST004). Consequently, a portion of the substrate is exposed from the mask.

The mask is formed, for example, by removing, by photolithography, a region of a protection layer made of photoresist that corresponds to a region (dividing region) of the substrate that is to be removed by etching. A region of a protection layer made of a thermosetting resin or a water-soluble resist that corresponds to the dividing region of the substrate may be removed by laser scribing. In the patterning, a portion of the substrate may be removed together with the protection layer.

(4) Obtainment of Second Processing Data

Second processing data relating to the formed mask is obtained (ST005).

In the present mode, the thickness of the mask is obtained as the second processing data.

(5) Plasma Etching

A portion of the mth substrate that is exposed from the mask is plasma etched based on the third recipe (ST006). Consequently, a plurality of element chips are formed, and the dicing process on the mth substrate ends.

(6) Modification of First Recipe

Whether or not the second processing data obtained as above is within a tolerable range is determined (ST007). Specifically, the mask thickness, which is an actual measured value, is compared with the mask thickness included in the target data, and whether or not the actual measured value is tolerable is determined.

If it is determined that the second processing data exceeds the tolerable range that is set based on the target data, the control unit generates a new first recipe (ST008), to modify the first recipe. The modified first recipe is used in the protection layer forming step (ST011) for the m+nth substrate. Consequently, a mask having a predetermined thickness is formed, so that it is possible to prevent the surface of each element chip from being directly exposed to plasma and damaged during plasma etching.

On the other hand, if it is determined that the second processing data is within the tolerable range, the first recipe will not be modified, and the initial first recipe is applied to the m+nth substrate.

For substrates subsequent to the m+nth substrate, a mask is also formed in the same manner as described above, and whether or not the first recipe needs to be modified is determined (ST012 to ST015). Then, the first recipe is modified as needed (ST016).

(Mode I-b)

The present mode is the same as mode I-a except that the modified first recipe is fed back to the protection layer formation for the mth substrate. Accordingly, high-quality element chips can be obtained with a high yield.

Figure 7:
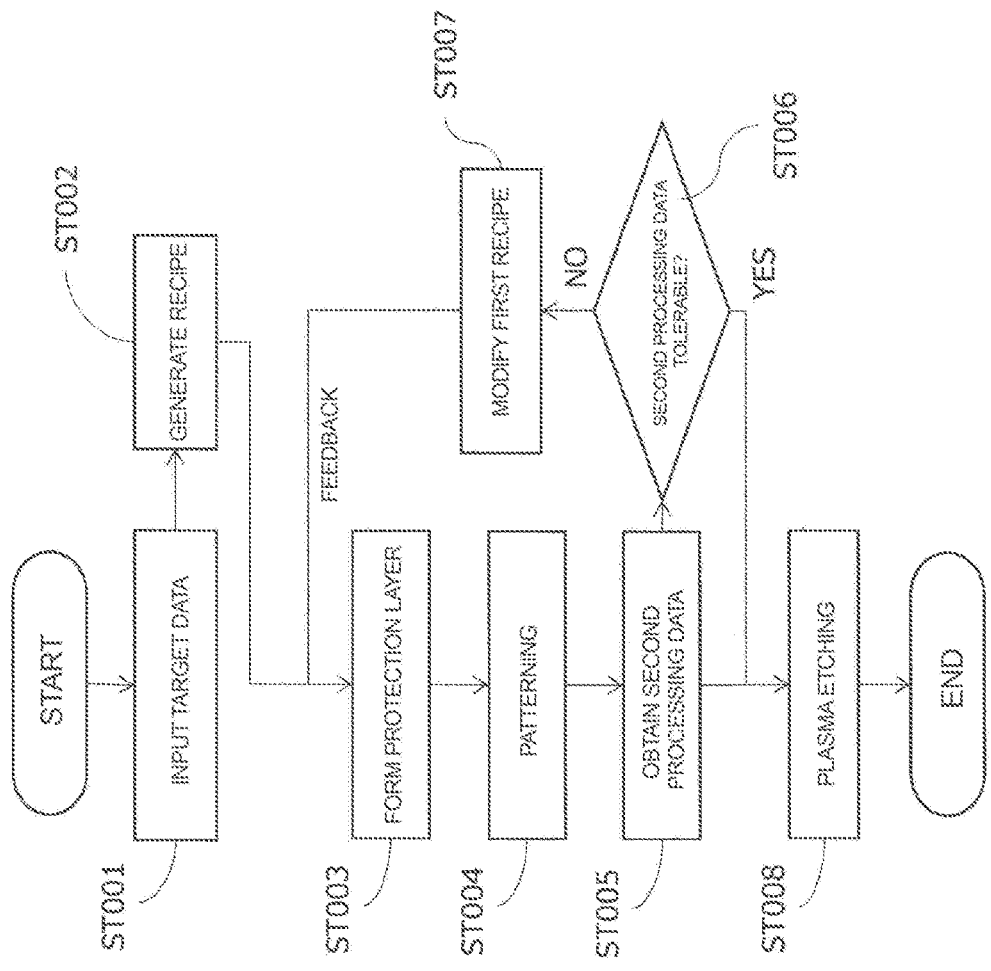
FIG. 7 is a flowchart illustrating mode I-b of the dicing method according to the embodiment of the present invention.

The present mode can be applied to a case where the mask is patterned by a method other than laser processing. The reason for this is that laser processing may cause a portion of the substrate to be removed during patterning. In the case where the mask is patterned by another method, the mask may be entirely removed for once, and a protection layer may be formed again on the mth substrate, based on the modified first recipe. FIG. 7 is a flowchart illustrating the present mode.

In the present mode, prior to performing plasma treatment for the mth substrate, determination is made as to whether or not the second processing data is within the tolerable range (ST006). If it is determined that the second processing data exceeds the tolerable range, the first recipe is modified (ST007). The modified first recipe is used for the reformation of the protection layer for the mth substrate. On the other hand, if it is determined that the second processing data is within the tolerable range, the first recipe will not be modified, and plasma treatment for the mth substrate is performed using the initial recipe (ST008).

(Mode I-c)

Figure 8:
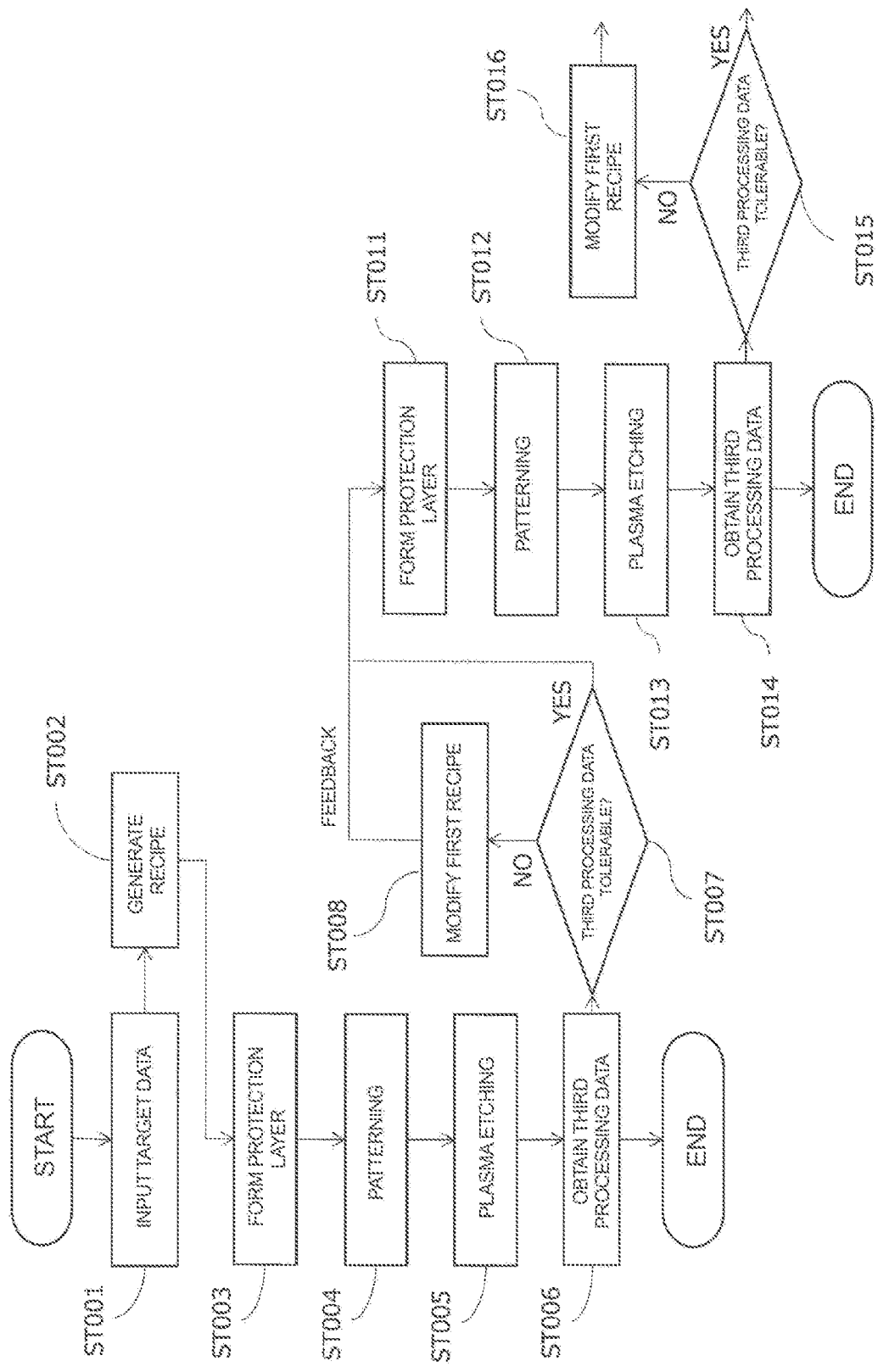
FIG. 8 is a flowchart illustrating mode I-c of the dicing method according to the embodiment of the present invention.

The present mode is the same as mode I-a except that third processing data relating to element chips produced form the mth substrate is used. The modified first recipe is fed back to the protection layer formation for the m+nth substrate. FIG. 8 is a flowchart illustrating the present mode.

In the present mode, after plasma etching, third processing data relating to the produced element chips is obtained (ST006). For example, the thickness of the mask covering the element chips is obtained as the third processing data. The mask thickness, which is an actual measured value, is compared with the mask thickness with the mask thickness included in the target data, and whether or not the actual value is tolerable is determined (ST007). If the third processing data is not tolerable, the first recipe is modified (ST008). The modified first recipe is used for the protection layer formation for the m+nth substrate. Accordingly, a mask having the desired thickness is formed.

Although the case where the mask thickness is used as the second processing data is described in mode I-a and mode I-b, the present invention is not limited thereto. In the case where projections and recesses formed by bumps, pad electrodes, and the like are present on the surface of the substrate, data relating to the covering state of the projections and recesses may be used as at least one of the first processing data, the second processing data, and the third processing data.

In the case where a substrate having projections and recesses is used, the thickness of the protection layer or the like covering the projections is likely to be smaller than the thickness of the protection layer or the like covering the recesses. Therefore, the mask covering the projections may be entirely removed during etching, so that the projections may be directly exposed to plasma and damaged. By modifying the first recipe using the data relating to the covering state of the projections and recesses as at least one of the first processing data, the second processing data, and the third processing data, it is possible to cover the projections by a protection layer or the like having a sufficient thickness. Thus, the quality of the resulting element chips is improved.

Although the second processing data or the third processing data is used in mode I-a, mode I-b, and mode I-c, whether or not the recipe needs to be modified may be determined using the first processing data. In this case, after forming a protection layer, first processing data relating to the formed protection layer is obtained. As the first processing data, it is desirable to use the thickness of the protection layer.

[Mode II]

In the present mode, whether or not to modify the second recipe is determined based on the second processing data and/or the third processing data.

(Mode II-a)

Figure 9:
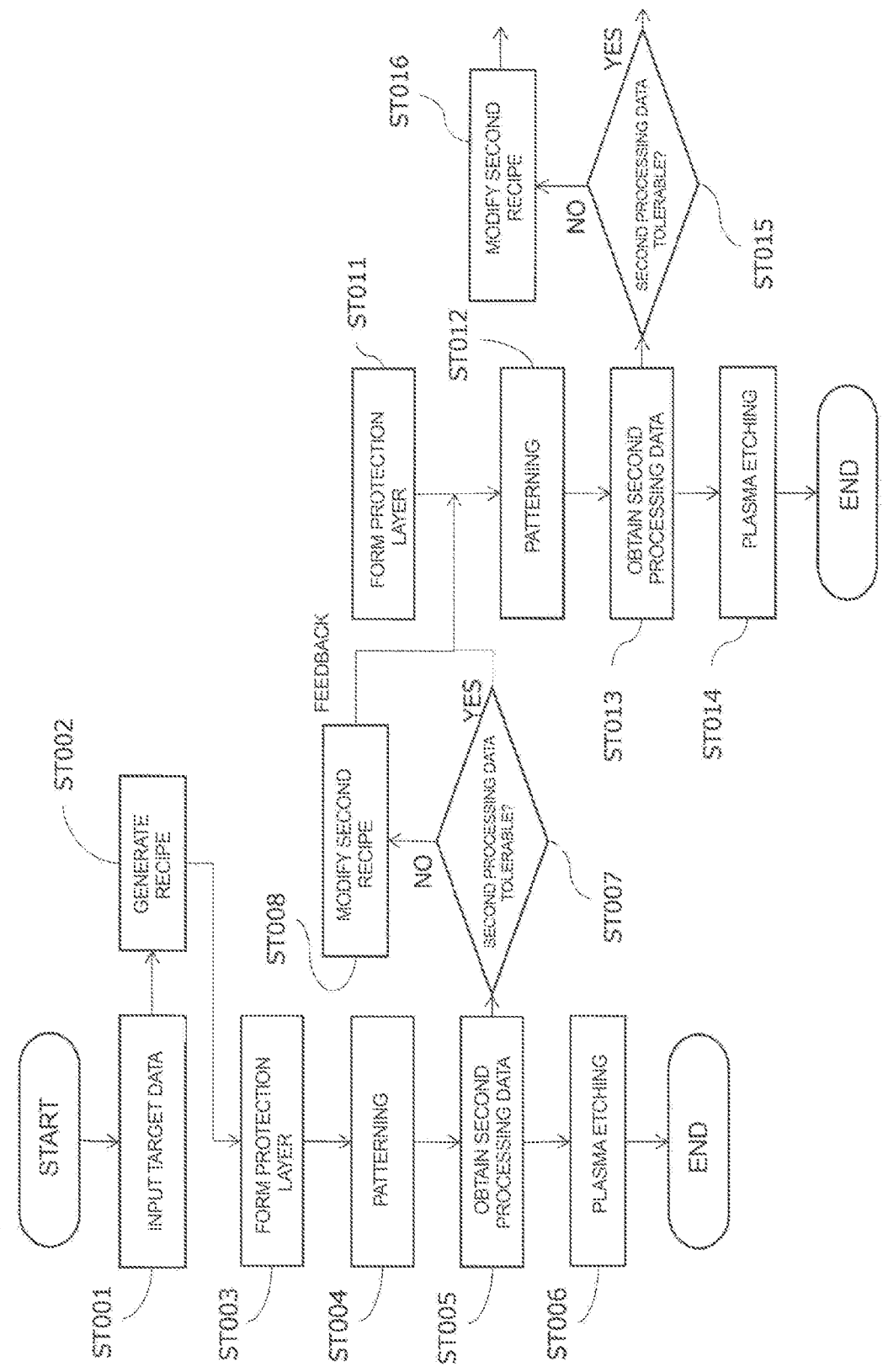
FIG. 9 is a flowchart illustrating mode II-a of the dicing method according to the embodiment of the present invention.

In the present mode, whether or not to modify a second recipe for controlling the patterning step is determined using second processing data relating to the mask formed on the mth substrate. Except for this, mode II-a is the same as mode I-a. The modified second recipe is fed back to the patterning for the m+nth substrate. FIG. 9 is a flowchart illustrating the present mode.

In the present mode, for example, a patterning width is obtained as the second processing data. The patterning width, which is an actual measured value, is compared with the patterning width included in the target data, and whether or not the actual measured value is tolerable is determined.

Figure 10:
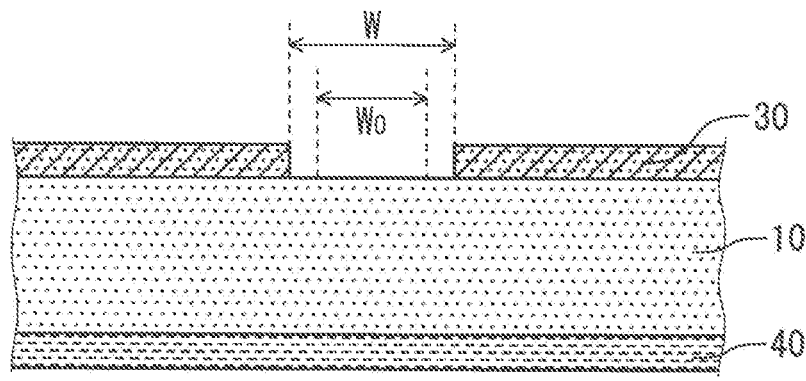
FIG. 10 is a cross-sectional view schematically showing a portion of a substrate (mth) after a patterning step, in the case where second processing data exceeds a tolerable range that is set based on target data.

FIG. 10 is a cross-sectional view schematically showing a portion of the mth substrate after the patterning step, in the case where the second processing data exceeds a tolerable range that is set based on the target data. A mask 30 is formed one principal surface of a substrate 10. The other principal surface of the substrate 10 is attached to and supported by a support member 40. The patterning width W of the mth substrate 10 is larger than a target value W0, and exceeds the tolerable range (W>>W0).

If the mth substrate is plasma treated based on the initial recipe, the etching amount is increased, resulting in a larger distance between the element chips. In the case where the substrate is supported by the support member, the support member functions as a stop layer. Accordingly, excessive plasma treatment causes the end face of each element chip on the support member side to be significantly recessed inward.

Figure 11:
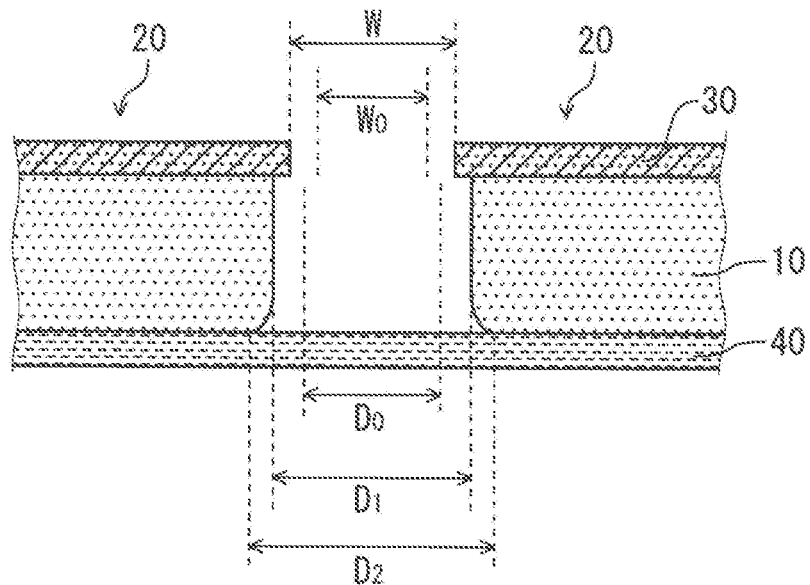
FIG. 11 is a cross-sectional view schematically showing a portion of a substrate (mth) after a plasma treatment step, in the case where second processing data exceeds a tolerable range that has been set based on target data.

FIG. 11 is a cross-sectional view schematically showing a portion of the mth substrate after the plasma treatment step, in the case where the second processing data exceeds a tolerable range that is set based on the target data A plurality of element chips 20 have been produced from the mth substrate. The distance D1 on the mask 30 side and the distance D2 on the support member 40 side between the element chips 20 are both larger than a target value D0, and exceed the tolerable range (D1, D2>>D0). Furthermore, the end face on the support member 40 side of each element chip 20 is recessed inward, and the distance D2 between the element chips 20 is larger than the distance D1 between the element chips 20. This indicates that the end face of the element chip 20 has low verticality.

Therefore, the modified second recipe is used when patterning the m+nth substrate. Accordingly, the patterning width falls within the tolerable range, and has a value suitable for the subsequent plasma treatment. Thus, the shapes of the plurality of element chips become uniform, and the verticality of the end face is increased.

Figure 12:
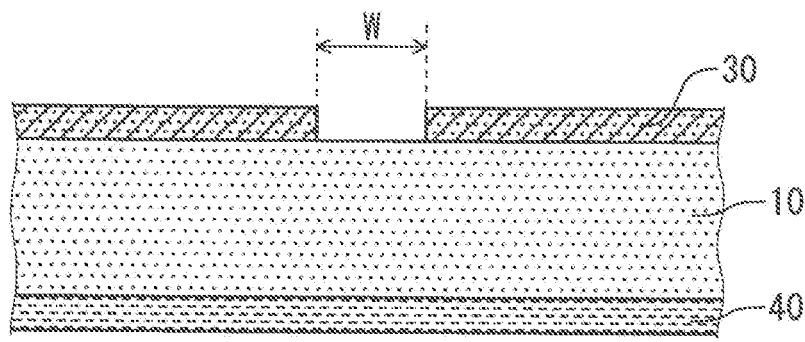
FIG. 12 is a cross-sectional view schematically showing a portion of a substrate (m+nth) that has been patterned using a modified second recipe.

FIG. 12 is a cross-sectional view schematically showing a portion of the m+nth substrate that has been patterned using the modified second recipe. The patterning width W falls within the tolerable range of the target value W0 (W0≈W0).

Figure 13:
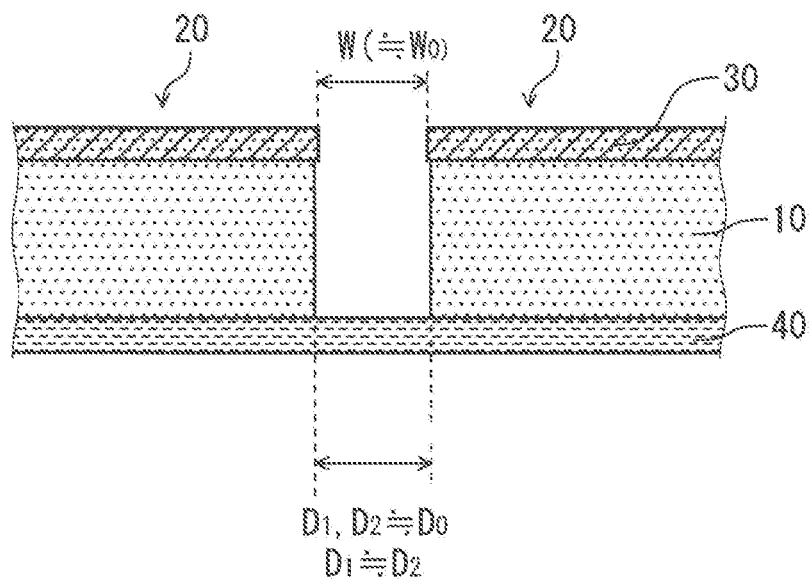
FIG. 13 is a cross-sectional view schematically showing a portion of a substrate (m+nth) that has been plasma-treated.

FIG. 13 is a cross-sectional view schematically showing a portion of the m+nth substrate that has been plasma treated. The distance D1 on the mask 30 side and the distance D2 on the side opposite to the mask 30 between the element chips 20 are both within the tolerable range of the target value D0 (D1, D2≈D0). Furthermore, the difference between the distance D2 and the distance D1 between the element chips 20 is small (D1≈D2), and the verticality of the end face of each element chip 20 is increased.

(Mode II-b)

Figure 14:
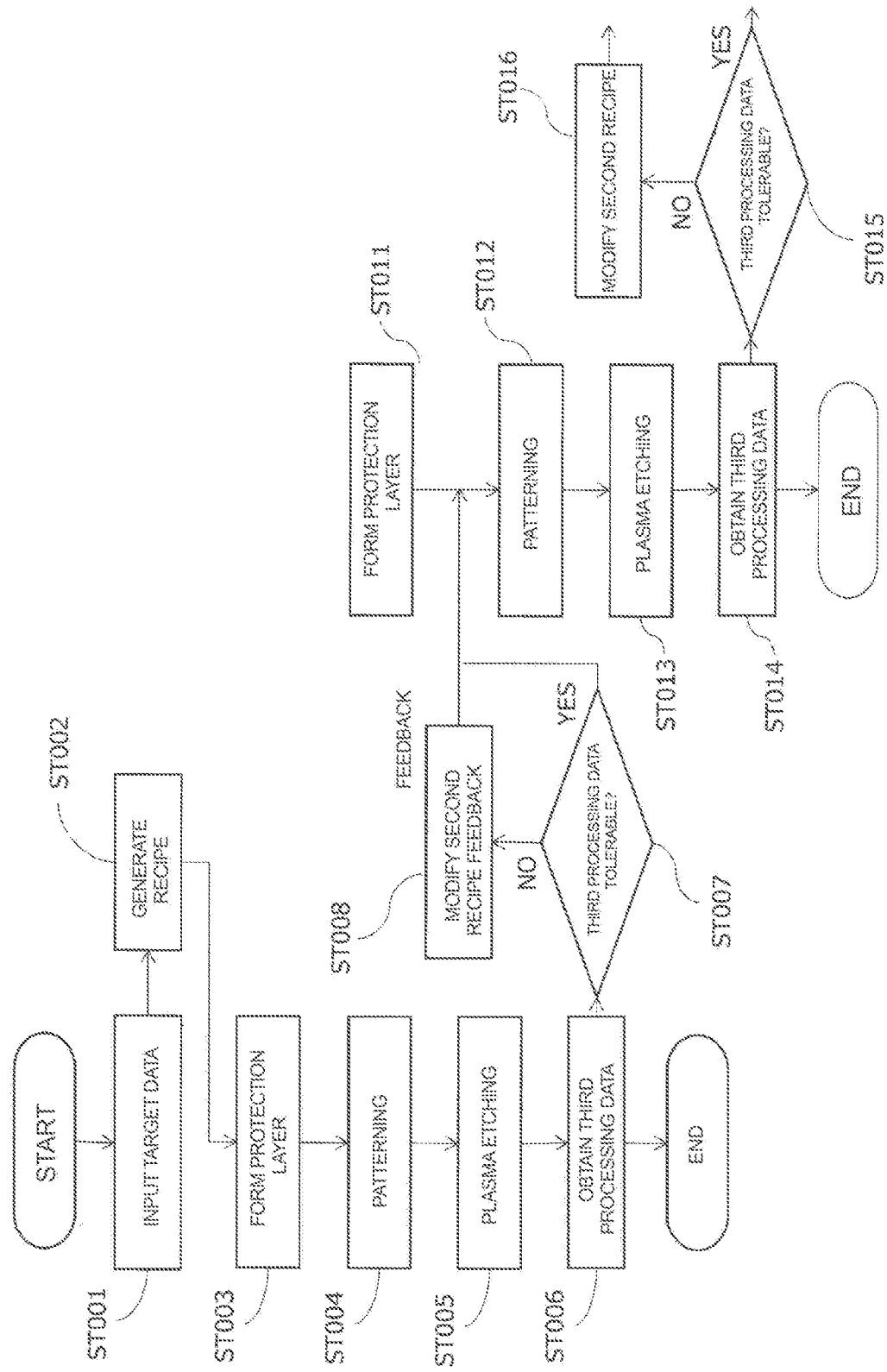
FIG. 14 is a flowchart illustrating mode II-b of the dicing method according to the embodiment of the present invention.

The present mode is the same as mode II-a except that third processing data relating to the element chips is used. The modified second recipe is fed back to the patterning for the m+nth substrate. FIG. 14 is a flowchart illustrating the present mode.

In the present mode, after plasma etching, third processing data relating to the produced element chips is obtained (ST006). For example, the distance between the adjacent element chips is obtained as the third processing data. The distance between the element chips, which is an actual measured value, is compared with the distance between the element chips included in the target data, and whether or not the actual measured value is tolerable is determined (ST007). If the actual measured value is not tolerable, the second recipe is modified (ST008). The modified second recipe is used for the protection layer formation for the m+nth substrate. Accordingly, the patterning width has a value suitable for the subsequent plasma treatment. Thus, the distance between the element chips is optimized.

[Mode III]

In the present mode, whether or not to modify the third recipe is determined based on the second processing data and/or the third processing data.

(Mode III-a)

Figure 15:
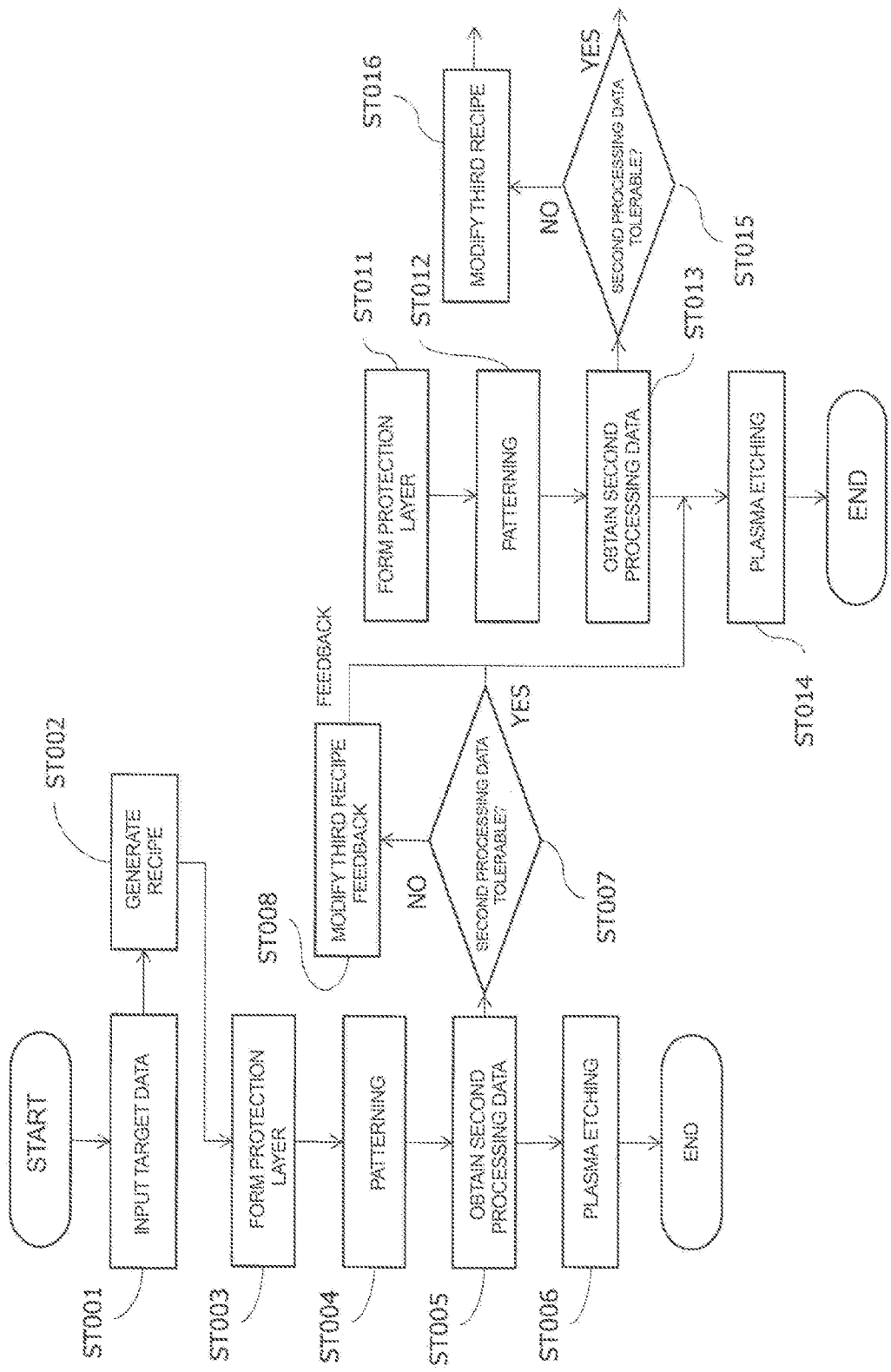
FIG. 15 is a flowchart illustrating mode III-a of the dicing method according to the embodiment of the present invention.

In the present mode, whether or not to modify a third recipe for controlling the plasma treatment step is determined using second processing data relating to the mask formed on the mth substrate. Except for this, mode III-a is the same as mode I-a. The modified third recipe is fed back to the plasma treatment for the m+nth substrate. FIG. 15 is a flowchart illustrating the present mode.

In the present mode, for example, a patterning width is obtained as the second processing data, and the obtained patterning width is compared with the patterning width included in the target data. However, in the present mode, even if the patterning width W, which is an actual measured value, exceeds the tolerable range of the target value W0 (W>>W0), the patterning is tolerated, and the third recipe is modified. That is, the quality of the element chips is improved by performing plasma treatment under a condition suitable for a wide patterning width.

However, the element chips produced using the modified third recipe need to fall within the tolerable range of the target data Therefore, before plasma treatment is performed on the m+nth substrate, the simulator may be caused to calculate predicted data relating to the element chips, based on the second processing data and the third recipe that is to be modified. If the predicted data falls within the tolerable range of the target value, the third recipe that is to be modified is adopted. On the other hand, if the predicted data exceeds the tolerable range of the target value, the calculation unit is caused to generate a recipe with which the predicted data falls within the tolerable range of the target value, and the third recipe that is to be modified is further modified.

Here, if the amount of deviation between the second processing data and the target value is excessively large (e.g., the mask shape significantly deviates from the target shape), the calculation unit may not be able to generate a third recipe with which the predicted data falls within the tolerable range of the target value. In this case, it is determined that the patterning is not tolerable, and a notification to that effect is provided by the notification unit or the like. Furthermore, if necessary, a second recipe relating to the mask may be modified. The modified second recipe is fed back to the mask formation for the m+nth substrate. Alternatively, the mask formed on the mth substrate may be entirely removed, and a protection layer and a mask may be formed again on the mth substrate, based on the modified second recipe.

Figure 16:
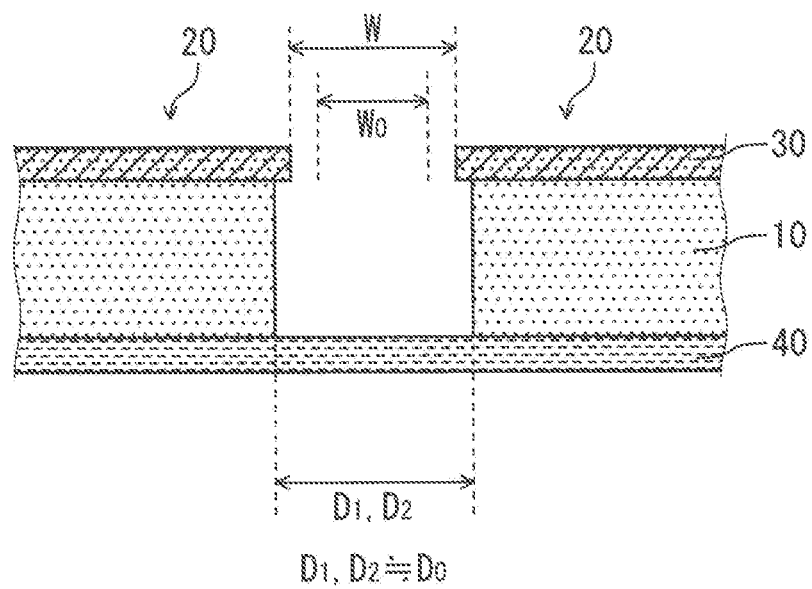
FIG. 16 is a cross-sectional view schematically showing a portion of a substrate (m+nth) that has been plasma-treated based on a modified third recipe.

FIG. 16 is a cross-sectional view schematically showing a portion of the m+nth substrate that has been plasma treated based on the modified third recipe. The distance D1 on the mask 30 side and the distance D2 on the side opposite to the mask 30 between the element chips 20 are both comparable to the target value D0 (D1, D2≈D0). Furthermore, the difference between the distance D2 and the distance D1 between the element chips 20 is also small.

(Mode III-b)

Figure 17:
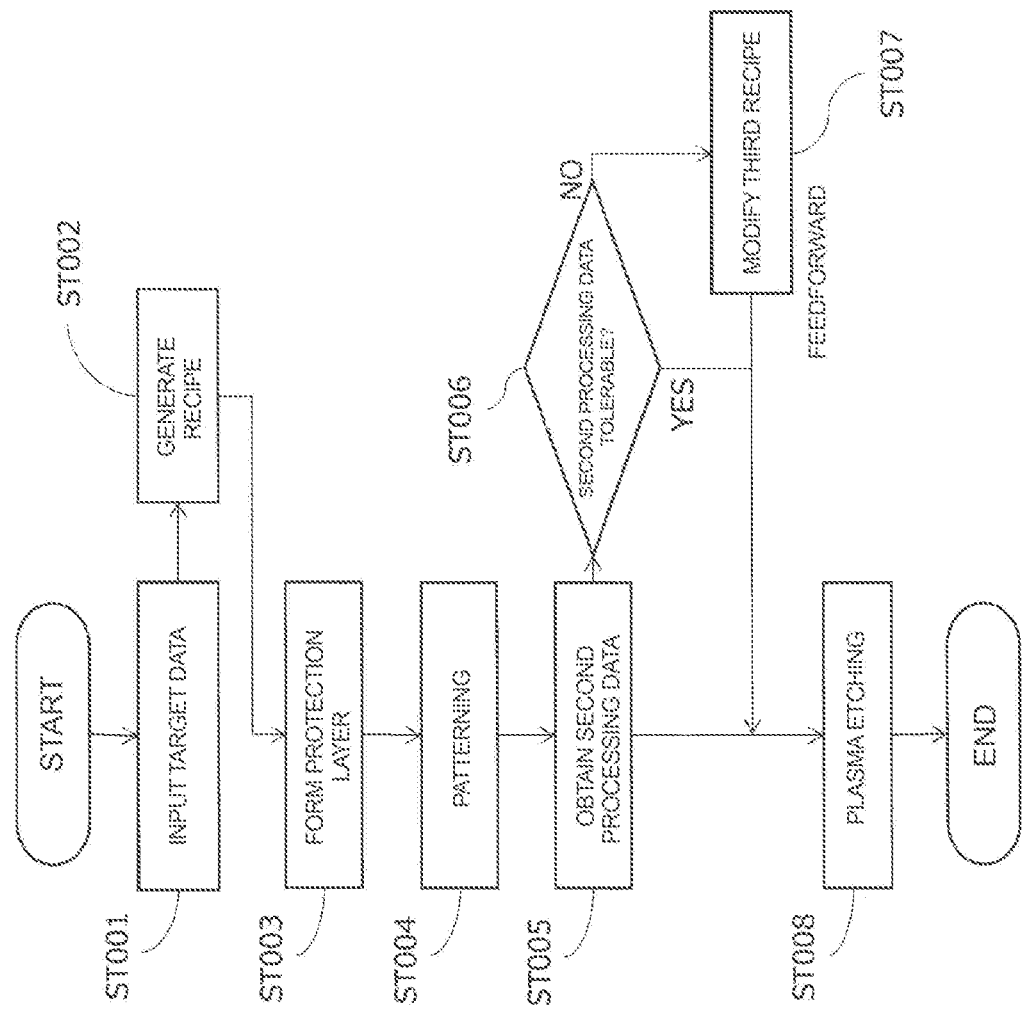
FIG. 17 is a flowchart illustrating mode of the dicing method according to the embodiment of the present invention.

The present mode is the same as mode III-a except that the modified third recipe is fed forward to the plasma treatment for the mth substrate. FIG. 17 is a flowchart illustrating the present mode.

In the present mode, the third recipe that has been modified based on the second processing data relating to the mth substrate is used for the plasma treatment for the same mth substrate. Accordingly, high-quality element chips can be obtained with a high yield.

In the present mode as well, a patterning width is obtained as the second processing data, and the obtained patterning width is compared with the patterning width included in the target data, as in the case of mode III-a. If the patterning width W, which is an actual measured value, exceeds the tolerable range of the target value W0 (W>>W0), the third recipe is modified. Accordingly, plasma treatment suitable for a wide patterning width is performed, so that the quality of the element chips is improved.

Figure 18:
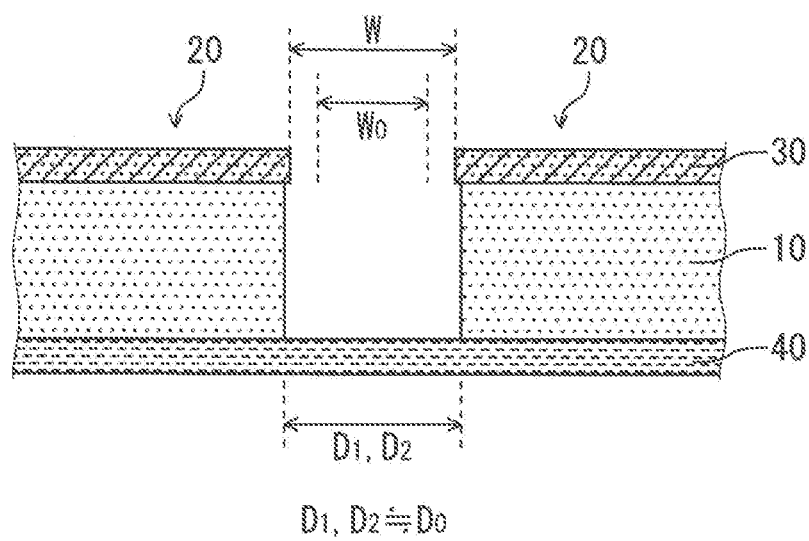
FIG. 18 is a cross-sectional view schematically showing a portion of a substrate (m+nth) that has been plasma-treated based on a modified third recipe.

FIG. 18 is a cross-sectional view schematically showing a portion of the Nth substrate that has been plasma treated based on the modified third recipe. The distance D1 on the mask 30 side and the distance D2 on the side opposite to the mask 30 between the element chips 20 are both comparable to the target value D0 (D1, D2≈D0). Furthermore, the difference between the distance D2 and the distance D1 between the element chips 20 is also small.

(Mode III-c)

Figure 19:
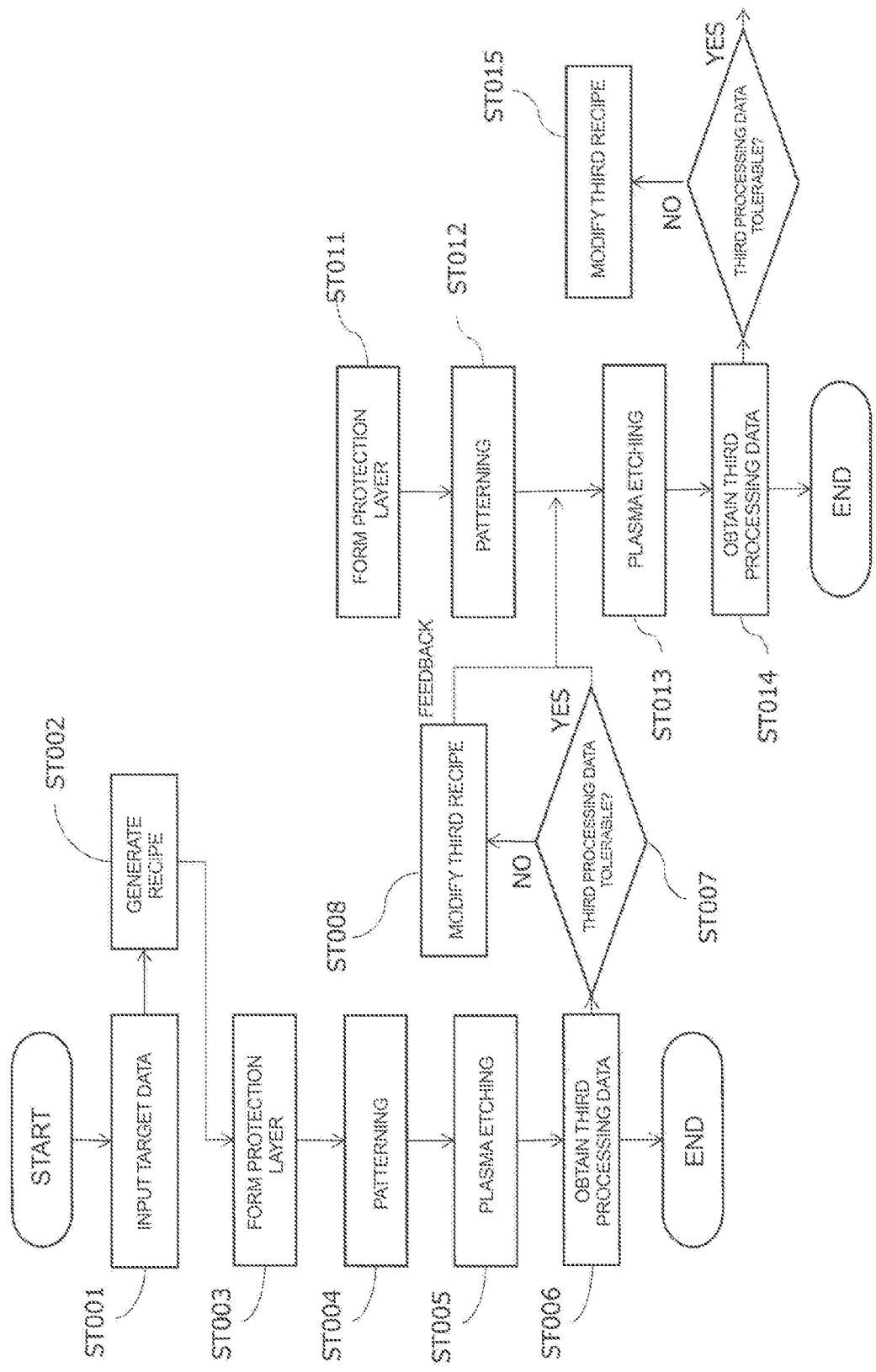
FIG. 19 is a flowchart illustrating mode of the dicing method according to the embodiment of the present invention.

The present mode is the same as mode III-a except that third processing data relating to element chips is used. The modified third recipe is fed back to the plasma treatment for the m+nth substrate. FIG. 19 is a flowchart illustrating the present mode.

In the present mode, for example, the size and the number of voids formed on the end face of each element chip, and the inclination angle of the end face are obtained as the third processing data. The actual measured values of these parameters representing the shape of the end face of each element chip are compared with the aforementioned parameters included in the target data, and whether or not the actual measured values are tolerable is determined.

Figure 20:
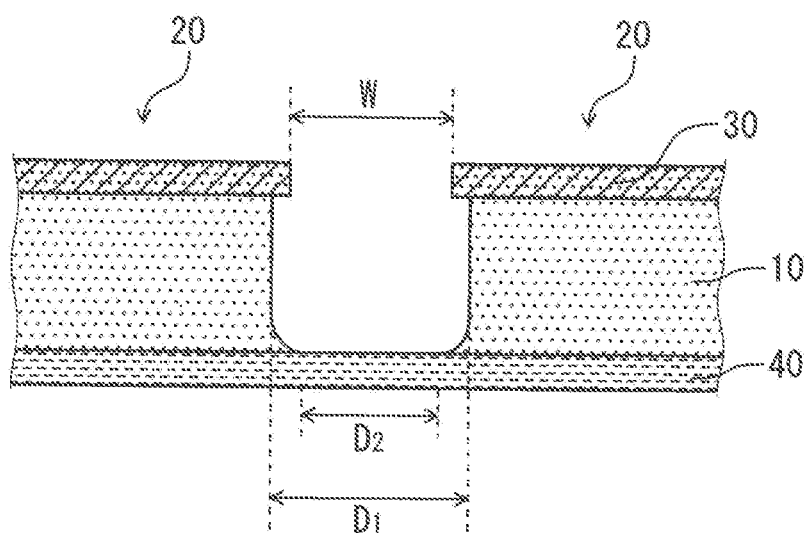
FIG. 20 is a cross-sectional view schematically showing a portion of a substrate (mth) that has been plasma-treated.

FIG. 20 is a cross-sectional view schematically showing a portion of the mth substrate that has been plasma treated. The distance D2 between the element chips 20 is smaller than the distance D1, so that the verticality of the end face has been reduced. Therefore, the modified third recipe is used when plasma treating the m+nth substrate. This optimizes the plasma treatment. Accordingly, the verticality of the end face is increased Although the dicing method according to the present embodiment has been described above using specific modes, the dicing method according to the present embodiment is not limited thereto.

For example, in each of the above-described modes, the case where whether or not the recipe needs to be modified is determined based on at least one of the second processing data and the third processing data. However, the determination method is not limited thereto. Whether or not the recipe needs to be modified may be determined based on both the second processing data and the third processing data. For example, in the case where the third processing data is good although the difference between the second processing data and the target data is large, it can be determined that the recipe does not need to be modified. On the other hand, in the case where the difference between the third processing data and the target data is large although the second processing data is good, it can be determined that the recipe needs to be modified.

INDUSTRIAL APPLICABILITY

With the use of the dicing system and the dicing method according to the present invention, the quality of the resulting element chips is improved, and therefore the dicing system and the dicing method according to the present invention can be suitably used for manufacturing various types of element chips.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

REFERENCE SIGNS LIST 1000A, 1000B, 1000C Dicing system
  100 Control unit
    101 Storage unit
    102 calculation unit
    103 Apparatus control unit
  200 Protection layer forming apparatus
  300 Patterning apparatus
  400 Plasma treatment apparatus
  500 Measuring apparatus
  600 Input unit
  700 Simulator
  800 Notification unit
  900 Ordering unit
10 Substrate
20 Element chip
30 Mask
40 Support member
D00 Target data
D01 First processing data
D02 Second processing data
D03 Third processing data
DB01 First database
DB02 Second database

The invention claimed is:

1. A dicing system comprising:
a protection layer forming apparatus that forms a protection layer on a surface of a substrate;
a patterning apparatus that patterns the protection layer to form a mask;
a plasma treatment apparatus that plasma etches the substrate exposed from the mask to form a plurality of element chips;
a measuring apparatus that obtains at least one processing data selected from the group consisting of first processing data relating to the protection layer, second processing data relating to the mask, and third processing data relating to the element chips; and
a control unit that operates at least one apparatus selected from the group consisting of the protection layer forming apparatus, the patterning apparatus, and the plasma treatment apparatus based on a recipe that is defined for each of the apparatuses,
wherein the control unit determines, based on the third processing data, whether or not to modify the recipe, modifies at least one of the recipes if the recipe needs to be modified, and operates at least one apparatus selected from the group consisting of the protection layer forming apparatus, the patterning apparatus, and the plasma treatment apparatus based on the modified recipe.

2. The dicing system according to claim 1,
wherein the third processing data includes a parameter representing a shape of an end face of each of the element chips.

3. The dicing system according to claim 2,
wherein if the recipe needs to be modified, the control unit modifies the recipe relating to the plasma treatment apparatus.

4. The dicing system according to claim 1,
wherein the third processing data includes a parameter representing a surface state of the mask covering surfaces of the element chips.

5. The dicing system according to claim 4,
wherein if the recipe needs to be modified, the control unit modifies at least one of the recipes relating to the protection layer forming apparatus, and the patterning apparatus.

6. A dicing system comprising:
a protection layer forming apparatus that forms a protection layer on a surface of a substrate;
a patterning apparatus that patterns the protection layer to form a mask;
a plasma treatment apparatus that plasma etches the substrate exposed from the mask to form a plurality of element chips;
a measuring apparatus that obtains at least one processing data selected from the group consisting of first processing data relating to the protection layer, second processing data relating to the mask, and third processing data relating to the element chips; and
a control unit that operates at least one apparatus selected from the group consisting of the protection layer forming apparatus, the patterning apparatus, and the plasma treatment apparatus based on a recipe that is defined for each of the apparatuses,
wherein the control unit determines, based on the second processing data, whether or not to modify the recipe, modifies at least one of the recipes if the recipe needs to be modified, and operates at least one apparatus selected from the group consisting of the protection layer forming apparatus, the patterning apparatus, and the plasma treatment apparatus based on the modified recipe.

7. The dicing system according to claim 6,
wherein the second processing data includes a patterning width.

8. The dicing system according to claim 7,
wherein if the recipe needs to be modified, the control unit modifies the recipe relating to the patterning apparatus.

9. A dicing system comprising:
a protection layer forming apparatus that forms a protection layer on a surface of a substrate;
a patterning apparatus that patterns the protection layer to form a mask;
a plasma treatment apparatus that plasma etches the substrate exposed from the mask to form a plurality of element chips;
a measuring apparatus that obtains at least one processing data selected from the group consisting of first processing data relating to the protection layer, second processing data relating to the mask, and third processing data relating to the element chips;

a control unit that operates at least one apparatus selected from the group consisting of the protection layer forming apparatus, the patterning apparatus, and the plasma treatment apparatus based on a recipe that is defined for each of the apparatuses;

a simulator that calculates, based on the second processing data and the recipe relating to the plasma treatment apparatus, predicted data relating to the element chip; and a calculation unit that calculates a difference between the predicted data and the third processing data, wherein the control unit determines, based on at least one of the obtained at least one processing data, whether or not to modify the recipe, modifies at least one of the recipes if the recipe needs to be modified, and operates at least one apparatus selected from the group consisting of the protection layer forming apparatus, the patterning apparatus, and the plasma treatment apparatus based on the modified recipe.

10. The dicing system according to claim 9, further comprising a notification unit that notifies a maintenance timing of the plasma treatment apparatus, wherein if an absolute value of the difference is greater than a preset threshold, the control unit causes the notification unit to notify the maintenance timing.

11. A dicing method comprising:

a protection layer forming step of forming, based on a first recipe, a protection layer on a surface of a substrate;

a patterning step of patterning, based on a second recipe, the protection layer to form a mask;

a plasma treatment step of plasma etching, based on a third recipe, the substrate exposed from the mask to form a plurality of element chips;

a measuring step of obtaining at least one processing data selected from the group consisting of first processing data relating to the protection layer, second processing data relating to the mask, and third processing data relating to the element chips;

a recipe modifying step of determining, based on at least one of the obtained at least one processing data, whether or not to modify the second recipe, and modifying the second recipe if the second recipe needs to be modified; and a feedback step of feeding back the modified second recipe to control of the patterning step.

12. A dicing method comprising:

a protection layer forming step of forming, based on a first recipe, a protection layer on a surface of a substrate;

a patterning step of patterning, based on a second recipe, the protection layer to form a mask;

a plasma treatment step of plasma etching, based on a third recipe, the substrate exposed from the mask to form a plurality of element chips;

a measuring step of obtaining at least one processing data selected from the group consisting of first processing data relating to the protection layer, second processing data relating to the mask, and third processing data relating to the element chips;

a recipe modifying step of determining, based on at least one of the obtained at least one processing data, whether or not to modify the third recipe, and modifying the third recipe if the third recipe needs to be modified; and a feedback step of feeding back the modified third recipe to control of the plasma treatment step.

13. A dicing method comprising:

a protection layer forming step of forming, based on a first recipe, a protection layer on a surface of a substrate;

a patterning step of patterning, based on a second recipe, the protection layer to form a mask;

a plasma treatment step of plasma etching, based on a third recipe, the substrate exposed from the mask to form a plurality of element chips;

a measuring step of obtaining second processing data relating to the mask;

a third recipe modifying step of determining, based on the obtained second processing data, whether or not to modify the third recipe, and modifying the third recipe if the third recipe needs to be modified; and a feedforward step of feeding forward the modified third recipe to control of the plasma treatment step.

* * * * *